(12) United States Patent
Gyoda et al.

(10) Patent No.: US 9,268,239 B2
(45) Date of Patent: Feb. 23, 2016

(54) EXPOSURE METHOD AND STORAGE MEDIUM

(75) Inventors: Yuichi Gyoda, Utsunomiya (JP); Kouichirou Tsujita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1107 days.

(21) Appl. No.: 13/224,488

(22) Filed: Sep. 2, 2011

(65) Prior Publication Data

US 2012/0075614 A1    Mar. 29, 2012

(30) Foreign Application Priority Data

Sep. 28, 2010  (JP) .................................. 2010-217760

(51) Int. Cl.
*G03F 7/20*     (2006.01)

(52) U.S. Cl.
CPC ................ *G03F 7/706* (2013.01); *G03F 7/705* (2013.01)

(58) Field of Classification Search
CPC ..... G03F 7/705; G03F 7/706; G03F 7/70091; G03F 7/70125
USPC ............................................. 355/77, 53, 67
See application file for complete search history.

(56) References Cited

U.S. PATENT DOCUMENTS

| | | | | |
|---|---|---|---|---|
| 2004/0158808 A1* | 8/2004 | Hansen | ............................ | 716/21 |
| 2006/0046168 A1* | 3/2006 | Fukuhara | ........................ | 430/30 |
| 2009/0074287 A1* | 3/2009 | Kawashima | ................... | 382/144 |
| 2010/0009275 A1* | 1/2010 | Mikami et al. | .................. | 430/30 |
| 2011/0032499 A1* | 2/2011 | Kawashima | .................... | 355/53 |

FOREIGN PATENT DOCUMENTS

| | | |
|---|---|---|
| JP | 4319560 B2 | 8/2009 |
| JP | 4378266 B2 | 12/2009 |

* cited by examiner

*Primary Examiner* — Peter B Kim
(74) *Attorney, Agent, or Firm* — Rossi, Kimms & McDowell LLP

(57) ABSTRACT

The present invention provides an exposure method including the steps of generating a plurality of element light sources formed on a pupil plane of an illumination optical system, setting a plurality of aberration states which are expected to exist in a projection optical system, calculating, for each of all combinations of the plurality of aberration states and the plurality of element light sources, an optical image of a pattern of a mask, which is formed in an evaluation area when one aberration state among the plurality of aberration states is produced in the projection optical system, and the pattern of the mask is illuminated with one element light source among the plurality of element light sources, determining, based on the calculated optical images, as a light intensity distribution to be formed on the pupil plane, a light source obtained by combining the plurality of element light sources applied with weights.

11 Claims, 20 Drawing Sheets

FIG. 4B

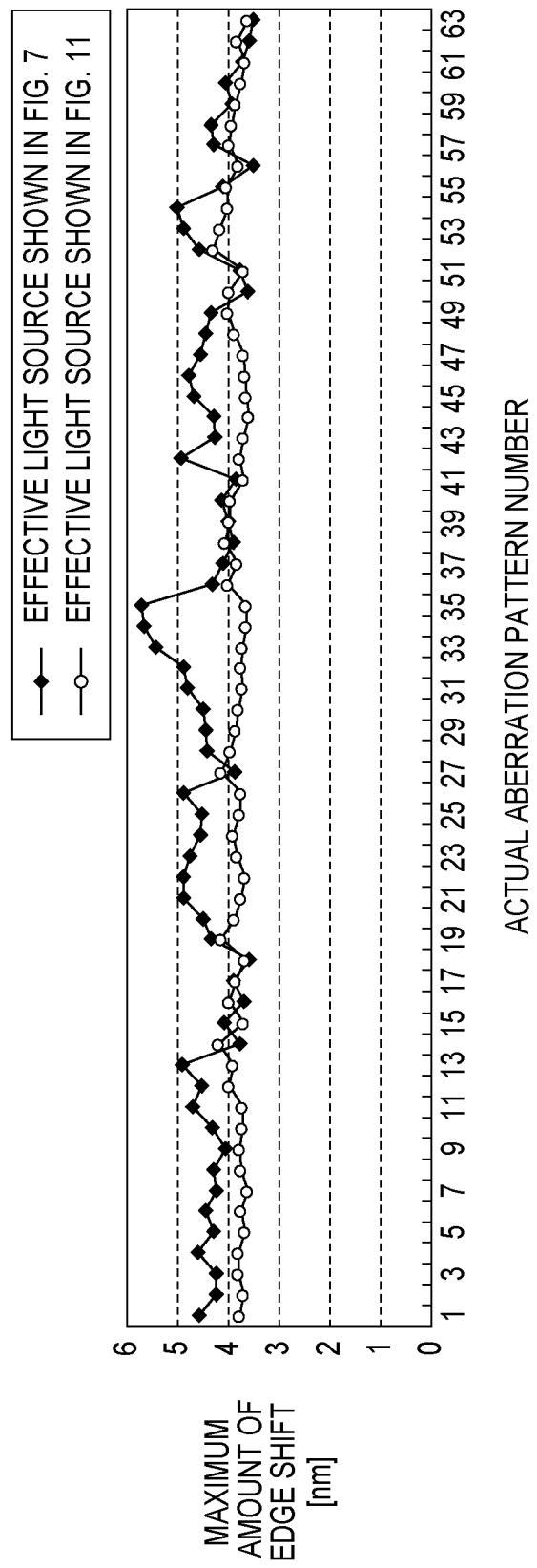

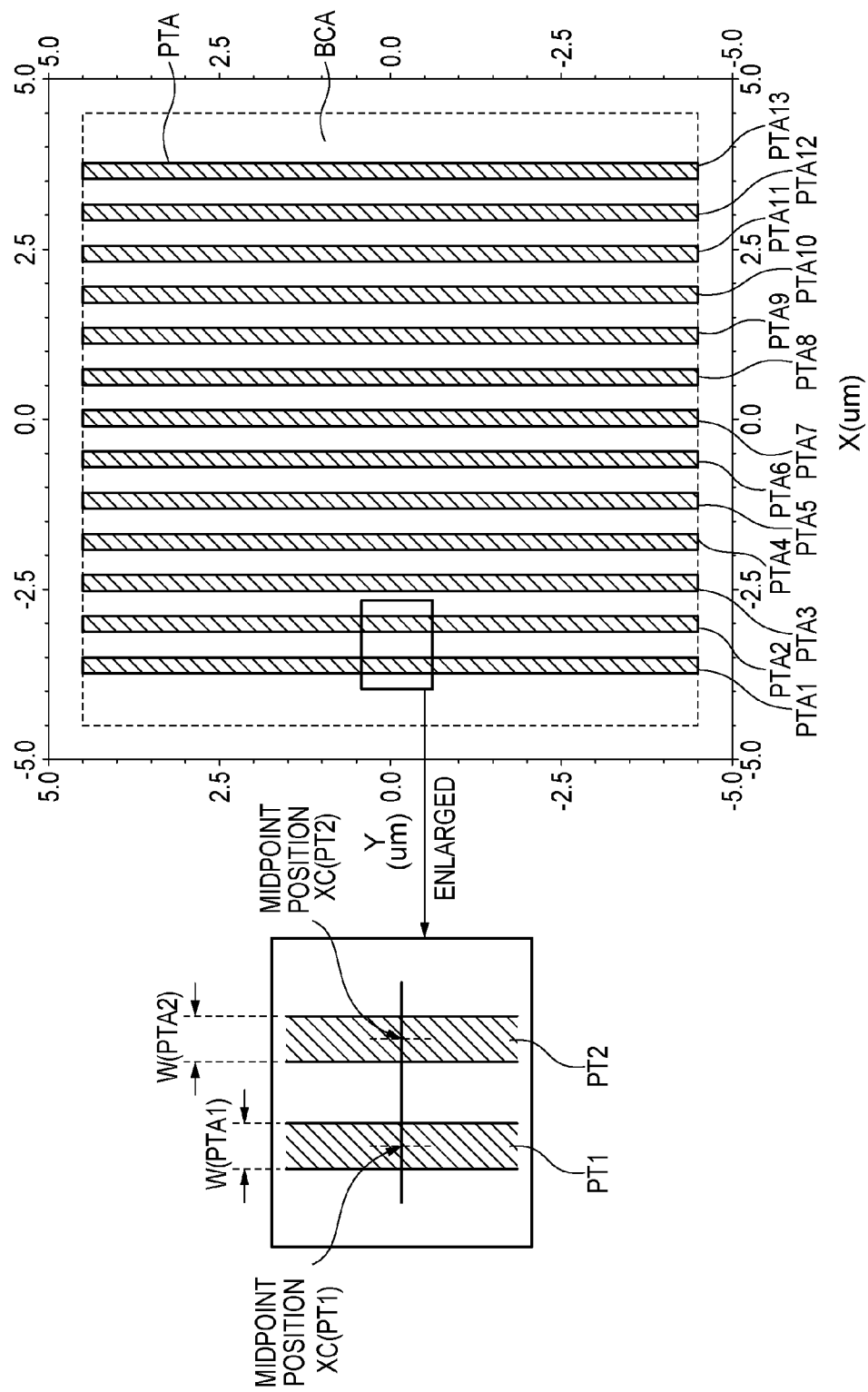
F I G. 16

F I G. 17
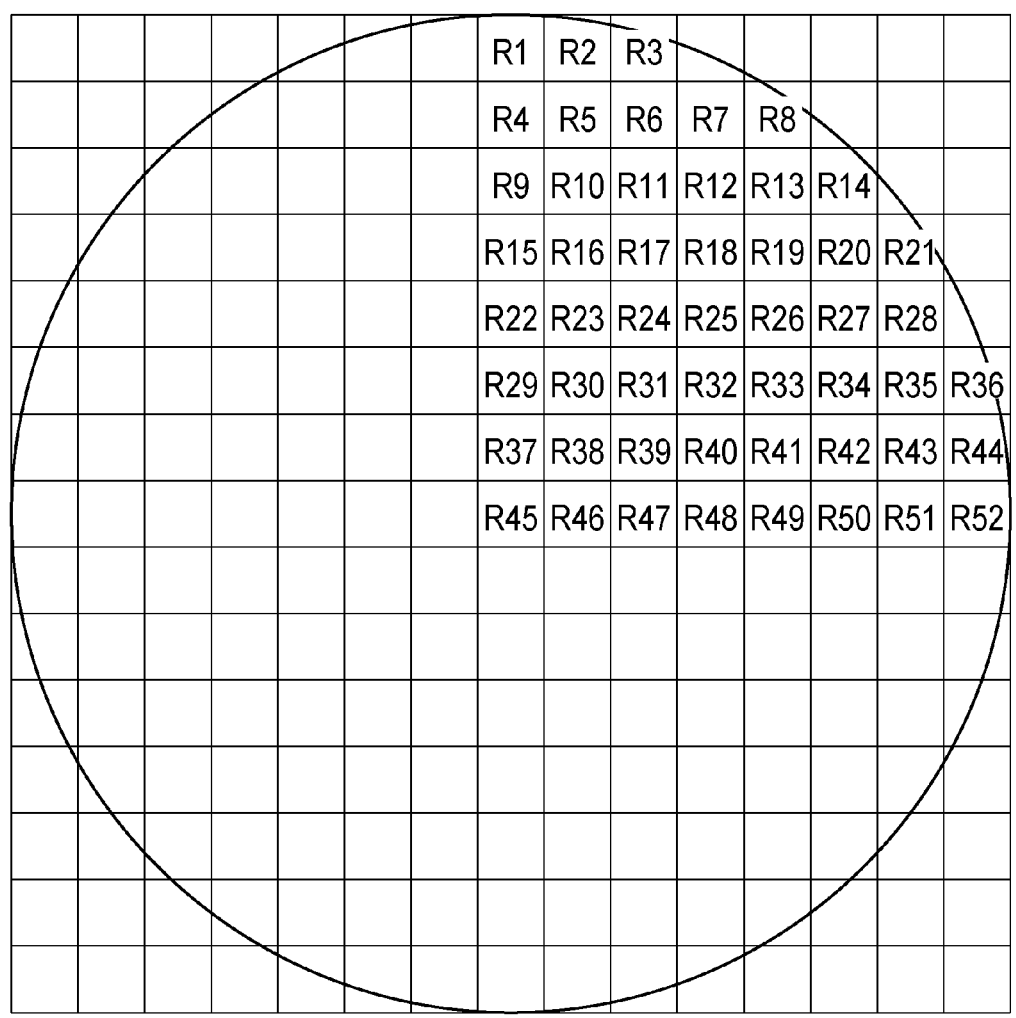

F I G. 18
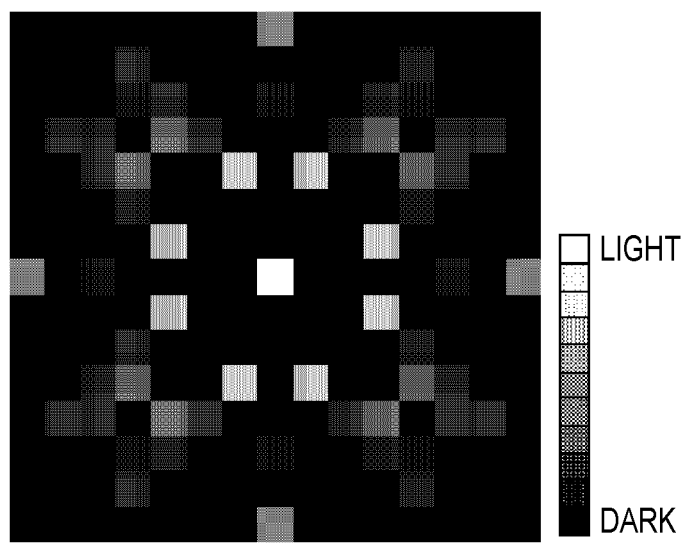

EXPOSURE METHOD AND STORAGE MEDIUM

BACKGROUND OF THE INVENTION

1. Field of the Invention

The present invention relates to an exposure method and a storage medium.

2. Description of the Related Art

An exposure apparatus is employed to fabricate a semiconductor device using a photolithography technique. The exposure apparatus projects and transfers the pattern of a mask (reticle) onto a substrate (for example, a wafer) by a projection optical system.

The exposure apparatus must transfer the pattern of the mask to a desired position in a desired shape. However, it is often the case that several error factors are present in exposure, and this leads to transfer of the pattern of the mask to a position different from a desired position in a shape different from a desired shape. Examples of the error factors include the amount of exposure and the focus position in exposing the substrate to light. Aberrations generated in the projection optical system can also be regarded as one type of error factors. Although the projection optical system includes a mechanism for correcting (controlling) the aberrations, this mechanism has a limited correction capability. Therefore, the projection optical system generally has residual aberrations. Note that the amount of residual aberration and the amount of fluctuation in aberration during exposure (that is, the amount of fluctuation in residual aberration due, for example, to generation of exposure heat) vary in each individual exposure apparatus.

With the recent advances in micropatterning of semiconductor devices, the edge positions of the optical image of the pattern on the substrate must precisely be controlled especially when the pattern of a mask used for a well process of an SRAM memory cell is to be transferred. However, if the projection optical system has aberrations typified by coma aberrations, the edge positions of the optical image significantly fluctuate (shift). Also, as described above, the aberrations of the projection optical system do not stay constant (that is, they fluctuate), and their magnitude also varies in each individual exposure apparatus. Hence, a demand has arisen for a technique of optimizing (determining) the effective light source (the light intensity distribution on the pupil plane of the illumination optical system) so that the pattern of the mask can be transferred with high accuracy even if the projection optical system has aberrations. Note that Japanese Patent No. 4378266 and No. 4319560 propose techniques of optimizing the effective light source.

Unfortunately, although the technique disclosed in Japanese Patent No. 4378266 determines an effective light source which maximizes the margin of the amount of exposure and the margin of the focus position upon defining the edge positions of the optical image of the pattern, it does not take into consideration aberrations existing in the projection optical system. As described above, the aberrations of the projection optical system always exist and fluctuate, and the optical image of the pattern synchronously fluctuates as well. The technique disclosed in Japanese Patent No. 4378266 does not take such influence into consideration at all, so it is impractical to apply this technique to an actual exposure apparatus.

Also, the technique disclosed in Japanese Patent No. 4319560 calculates the response characteristics of the image performance of the optical image to a specific aberration which is generated in each light source obtained by dividing the pupil plane of the illumination optical system, thereby determining an effective light source so that the response characteristics of the image performance to this aberration become poor. However, the technique disclosed in Japanese Patent No. 4319560 does not take into consideration control of the edge positions of the optical image, and therefore does not determine an effective light source which reduces the fluctuation in edge position of the optical image due to a specific aberration. In addition, the technique disclosed in Japanese Patent No. 4319560 does not guarantee a given image performance of the optical image against an unknown aberration, and therefore cannot cope with a situation in which a plurality of exposure apparatuses commonly use the same effective light source or that in which aberrations remain behind or fluctuate.

SUMMARY OF THE INVENTION

The present invention provides a technique advantageous for determining a light intensity distribution to be formed on the pupil plane of an illumination optical system.

According to one aspect of the present invention, there is provided an exposure method of exposing a substrate to light using an illumination optical system which illuminates a mask, and a projection optical system which projects a pattern of the mask onto the substrate, the method including a first step of setting a pattern of a mask to be placed on an object plane of the projection optical system, a second step of setting an evaluation area used to evaluate an optical image of the pattern of the mask set in the first step, which is formed on the image plane of the projection optical system, a third step of generating a plurality of element light sources formed on a pupil plane of the illumination optical system, a fourth step of setting a plurality of different aberration states which are expected to exist in the projection optical system, a fifth step of calculating, for each of all combinations of the plurality of aberration states and the plurality of element light sources, an optical image of the pattern of the mask, which is formed in the evaluation area set in the second step when one aberration state selected from the plurality of aberration states set in the fourth step is produced in the projection optical system, and the pattern of the mask is illuminated with one element light source selected from the plurality of element light sources generated in the third step, a sixth step of determining, based on the optical images calculated in the fifth step, a weight to be applied to each of the plurality of element light sources such that an edge position, in the evaluation area, of each of the optical images of the pattern of the mask comes close to a target edge position, thereby determining, as a light intensity distribution to be formed on the pupil plane of the illumination optical system, a light source obtained by combining the plurality of element light sources applied with the weights, a seventh step of illuminating the mask with light emitted by the illumination optical system which forms the light intensity distribution determined in the sixth step, and an eighth step of projecting an image of the pattern of the mask onto the substrate via the projection optical system, wherein the first step to the six step are performed by a computer.

Further features of the present invention will become apparent from the following description of exemplary embodiments with reference to the attached drawings.

BRIEF DESCRIPTION OF THE DRAWINGS

FIGS. 4A and 4B are views for explaining element light sources generated in step S108 of the flowchart shown in FIG. 1.

FIG. 12 is a graph showing the simulation results obtained when 63 actual aberration patterns are produced in a projection optical system, and the mask pattern shown in FIG. 2 is illuminated with the effective light sources shown in FIGS. 11 and 7.

FIG. 16 is a view illustrating an example of a mask pattern set in step S1502 of the flowchart shown in FIG. 15.

FIG. 17 is a view for explaining element light sources generated in step S1508 of the flowchart shown in FIG. 15.

FIG. 18 is a view showing an effective light source determined in step S1520 of the flowchart shown in FIG. 15.

DESCRIPTION OF THE EMBODIMENTS

Figure 1:
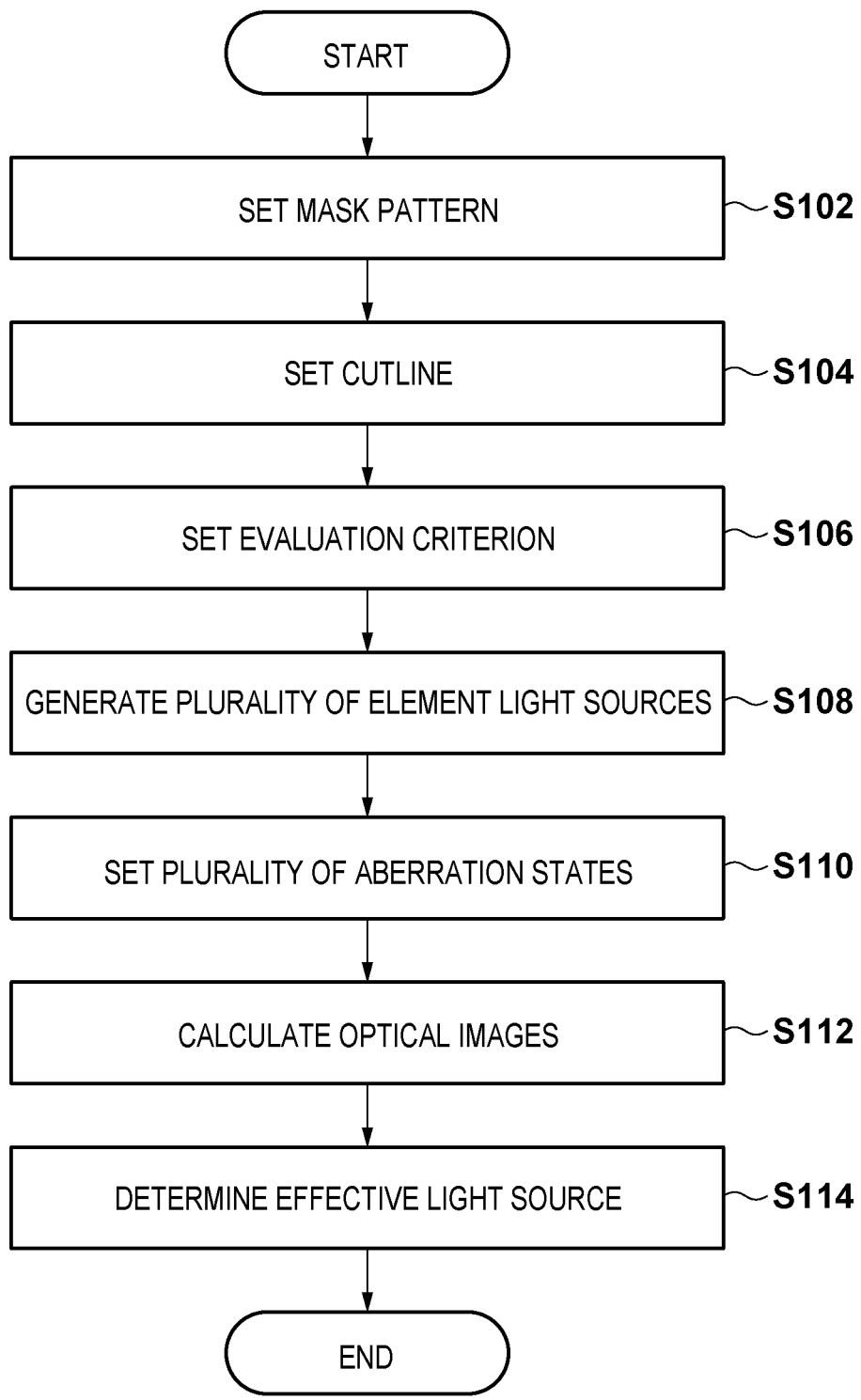
FIG. 1 is a flowchart for explaining a determination method according to an aspect of the present invention.

Preferred embodiments of the present invention will be described below with reference to the accompanying drawings. Note that the same reference numerals denote the same members throughout the drawings, and a repetitive description thereof will not be given.

The present invention is applicable to determination of an effective light source used in micromechanics and in fabricating various devices such as a semiconductor chip such as an IC or an LSI, a display device such as a liquid crystal panel, a detection device such as a magnetic head, and an image sensing element such as a CCD. The micromechanics means herein a technique of creating a micron-scale machinery system with sophisticated functions by applying a semiconductor integrated circuit fabrication technique to microstructure fabrication, or the machinery system itself.

<First Embodiment>

FIG. 1 is a flowchart for explaining a determination method according to an aspect of the present invention. The determination method in this embodiment is executed by an information processing apparatus such as a computer to determine (optimize) an effective light source used to illuminate a mask (reticle) in an exposure apparatus including an illumination optical system which illuminates the mask, and a projection optical system which projects the pattern of the mask onto a substrate. The effective light source means herein a light intensity distribution formed on the pupil plane of the projection optical system while no mask is placed on the object plane of the projection optical system. Therefore, determining an effective light source amounts to determining a light intensity distribution to be formed on the pupil plane of the illumination optical system.

Figure 2:
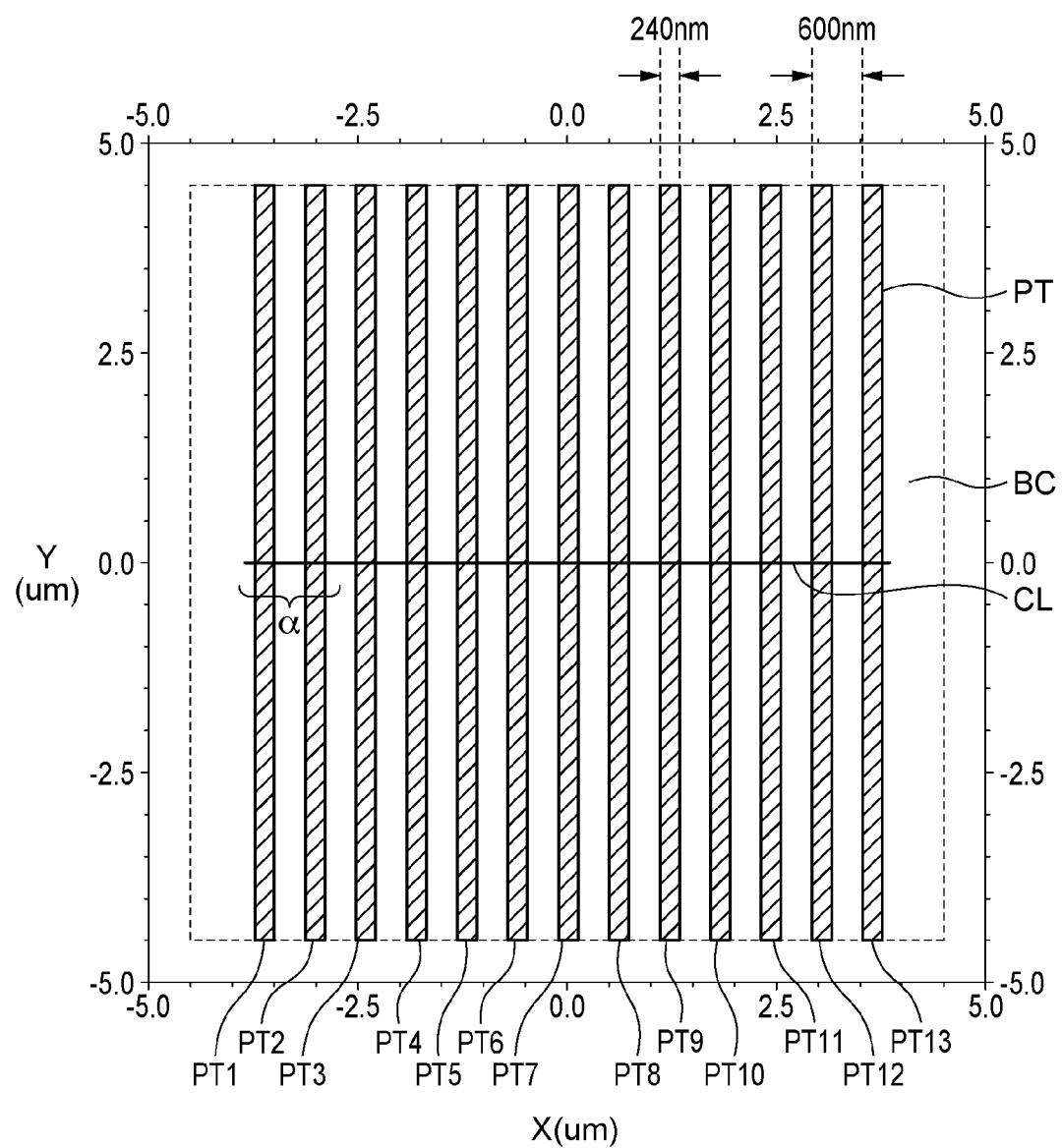
FIG. 2 is a view illustrating an example of a mask pattern set in step S102 of the flowchart shown in FIG. 1.

In step S102, the pattern (mask pattern) of a mask to be placed on the object plane of the projection optical system is set. In this embodiment, a mask pattern including a pattern group PT formed from light-shielding portions (transmittance: 0%), and a background portion BC formed from a light-transmitting portion (transmittance: 100%) is set, as shown in FIG. 2. This mask pattern is a general mask pattern used for an SRAM well process, and is designed as a one-dimensional line-and-space pattern having a line width of 240 nm and a pitch of 600 nm. The mask pattern shown in FIG. 2 includes 13 bilaterally symmetric patterns PT1 to PT13. All the patterns PT1 to PT13 have a line width of 240 nm because mask bias, for example, is not taken into consideration. Also, in this embodiment, not only the mask pattern shown in FIG. 2 but also the mask pattern obtained by rotating that shown in FIG. 2 through 90° (that is, obtained by interchanging the ordinate and the abscissa in the former mask pattern while the line width and pitch of its lines and spaces remain the same) is set as well.

A mask pattern generally includes various patterns. In step S102, either all types of patterns or necessary patterns included in the mask pattern may be set. Also, although a two-dimensional mask pattern is set in this embodiment, a one- or three-dimensional mask pattern may be set. Moreover, although a binary mask is set in this embodiment, a phase shift mask or another type of mask may be set.

In step S104, a cutline (evaluation areas) used to evaluate an optical image (an image formed on the image plane of the projection optical system) of the mask pattern set in step S102 is set. In this embodiment, a cutline CL is set in a portion on the image plane of the projection optical system, which corresponds to the central portions of the patterns PT1 to PT13 (see FIG. 2). Although a cutline is set so as to perpendicularly run across the patterns PT1 to PT13 in this embodiment, it may be set at another position. Also, FIG. 2 shows setting of a cutline for the mask pattern assuming that the dimension on the object plane of the projection optical system and that on the image plane of the projection optical system are equal to each other (that is, the projection optical system has unit magnification) for the sake of descriptive simplicity. However, in practice, a cutline must be set on the image plane of the projection optical system in consideration of a mask pattern having a dimension corresponding to that on the image plane, based on the magnification of the projection optical system.

In step S106, an evaluation criterion used to evaluate the optical image of the mask pattern is set. In this embodiment, first, target edge positions (target values) for the edge positions of an optical image of the mask pattern, which is formed on the cutline set in step S104, are set. The edge position of the optical image corresponds to that of the resist on the substrate, and the target edge position means the position on the substrate, at which an image defining the edge position of the resist (optical image) is desirably formed.

Figure 3:
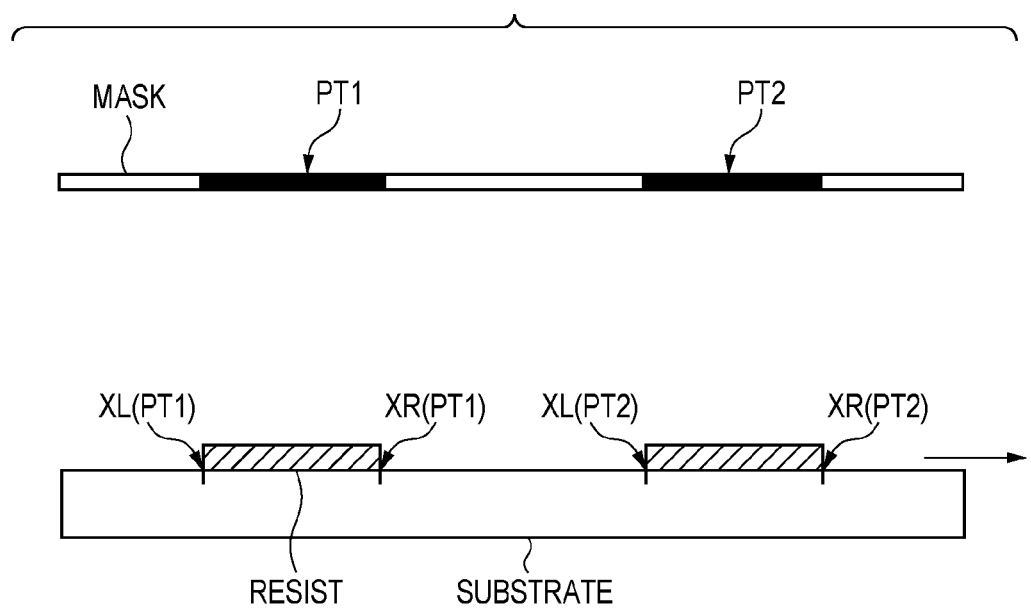
FIG. 3 is a schematic view showing the relationship between the mask pattern and the edge positions of a resist.

FIG. 3 is a view showing the relationship between the mask pattern and the edge positions of the resist. FIG. 3 shows a cross-section of the mask and substrate in partial region a on the cutline CL shown in FIG. 2. Referring to FIG. 3, the patterns PT1 and PT2 (their optical images) are transferred onto the resist on the substrate via the projection optical system. In this case, the positions (coordinates) of the right and left edges of the resist will be referred to as edge positions hereinafter, so that the position of the left edge of the resist (optical image) for a pattern PTn (n: integers of 1 to 13) is defined as an edge position XL(PTn), and that of the right edge of the resist (optical image) for the pattern PTn is defined as an edge position XL(PTn).

In this embodiment, target edge positions are set as follows:

XL(PT1)=−3720 nm, XR(PT1)=−3480 nm
XL(PT2)=−3120 nm, XR(PT2)=−2880 nm
XL(PT3)=−2520 nm, XR(PT3)=−2280 nm
XL(PT4)=−1920 nm, XR(PT4)=−1680 nm
XL(PT5)=−1320 nm, XR(PT5)=−1080 nm
XL(PT6)=−720 nm, XR(PT6)=−480 nm
XL(PT7)=−120 nm, XR(PT7)=+120 nm

Although target edge positions for only the patterns PT1 to PT7 are shown herein, they are set for all the patterns PT1 to PT13. More specifically, positions symmetric with respect to the target positions of the patterns PT6 to PT1 are set as target edge positions for the patterns PT8 to PT13, respectively, based on the symmetry of the mask pattern.

Although each target edge position is set to coincide with its corresponding edge position of the mask pattern in this embodiment, they need not always coincide with each other. As will be described later, when, for example, the shape of the mask pattern is changed (optimized), each edge position of the mask pattern and its corresponding target edge position are different from each other.

Using the thus set target edge positions, an evaluation criterion used to evaluate the optical image of the mask pattern is set. In this embodiment, the maximum value of the difference (to be referred to as the "amount of edge shift" hereinafter) between the target edge position of the optical image and the edge position of this optical image obtained by optical simulation, that is, the maximum amount of edge shift in the mask pattern is set as an evaluation criterion. The mask pattern set in step S102 includes, for example, 26 patterns (includes a total of 26 patterns because the mask pattern obtained by rotating that shown in FIG. 2 through 90° is also set, as described above). Because the mask pattern includes 26 patterns, 52 edge positions exist. An amount of edge shift is obtained for each of these 52 edge positions, and an amount of edge shift which has a maximum absolute value, among the obtained amounts of edge shift, is determined as a maximum amount of edge shift. Although the maximum amount of edge shift is set as an evaluation criterion in this embodiment, any parameter which reflects the edge position (its shift) of the optical image can be set as an evaluation criterion, so the average of the amounts of edge shift, for example, may be set as an evaluation criterion.

Figure 4A:
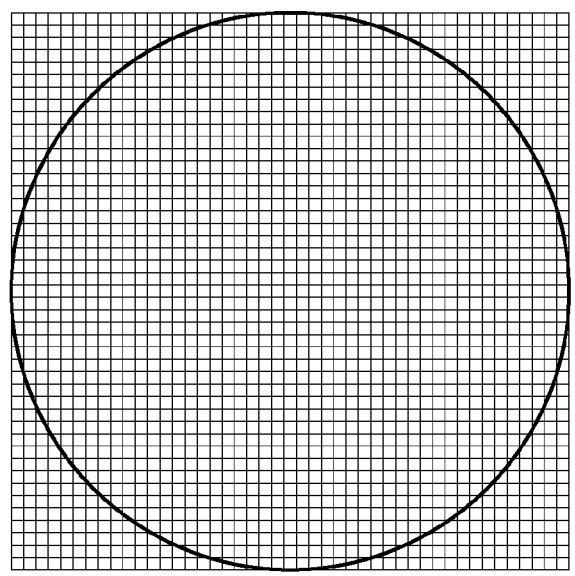

In step S108, a plurality of different element light sources formed on the pupil plane of the illumination optical system are generated. For example, the pupil plane of the illumination optical system is divided into a plurality of regions in a grid pattern (divided into 63×63 regions), and only one of these plurality of regions is illuminated to generate it as an element light source, as shown in FIG. 4A. Note that regions R1 to R813 (that is, the upper right quarter) shown in FIG. 4B, among the plurality of regions obtained by dividing the pupil plane of the illumination optical system, need only be evaluated because of the symmetry of the effective light source. Note that a circle shown in FIG. 4A represents that with a coherence factor of 1.

Figure 5A:
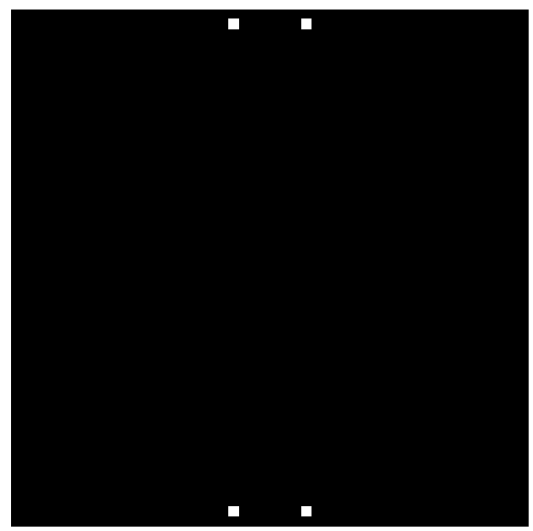
FIGS. 5A and 5B are views illustrating examples of a plurality of element light sources generated in step S108 of the flowchart shown in FIG. 1.
Figure 5B:
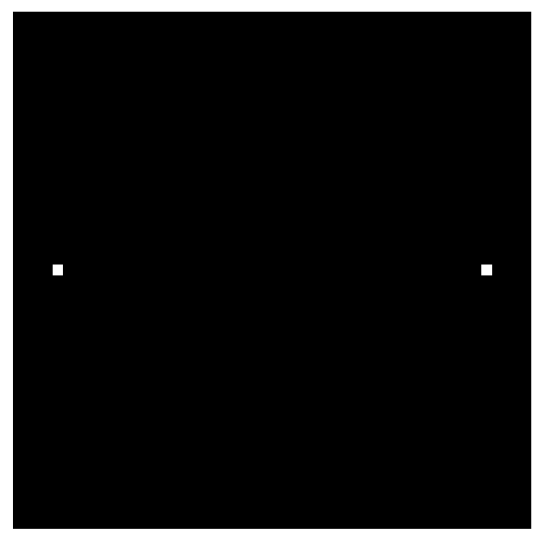

FIGS. 5A and 5B are views illustrating examples of the plurality of element light sources generated in step S108. FIG. 5A shows an element light source obtained by illuminating only the region R10, and FIG. 5B shows an element light source obtained by illuminating only the region R807. Note that the element light sources shown in FIGS. 5A and 5B have vertically and horizontally symmetric regions being illuminated, based on the symmetry of the effective light source. In this embodiment, only one of the plurality of regions R1 to R813 is illuminated to generate it as an element light source, so 813 element light sources are generated. The linear sum (a light source obtained by combining the plurality of element light sources generated in step S108) of the plurality of element light sources generated in step S108 is finally determined as an effective light source.

Although the pupil plane of the illumination optical system is divided in a grid pattern in this embodiment, it may be divided in another shape such as an arcuated shape. Also, to optimize the effective light source by limiting it to an annular shape, annular element light sources need only be set. Moreover, to optimize the effective light source obtained by superposing a quasar shape and a small-sigma shape, element light sources having a quasar shape and those having a small-sigma shape need only be set.

Although each divided region is illuminated one by one to generate it as one element light source in this embodiment, a set of a plurality of regions may be illuminated at once to generate them as one element light source.

In step S110, a plurality of different aberration states (a plurality of different aberration patterns produced in the projection optical system) which are expected to exist in the projection optical system are set. In this embodiment, the aberration pattern means the wavefront aberration shape. The wavefront aberration can generally be defined by Zernike polynomials. When, for example, 36 Zernike polynomial terms are to be evaluated, one wavefront aberration shape is defined by determining 36 coefficients. Also, the coefficient of each Zernike polynomial term is generally called C1, C2, C3, . . . in turn from the first term, so each term corresponds to a specific type of aberration.

In this embodiment, nine aberration patterns are set, as shown in Table 1. The unit of the aberration (amount of aberration) in Table 1 is mλ (λ is the wavelength of exposure light). Referring to Table 1, in aberration pattern 1, the values (coefficients) of terms C7, C8, C10, C11, C14, C15, C30, C31, and other terms are set to zero. Also, in aberration pattern 2, the value of only term C7 is set to 15 mλ, and those of other terms are set to zero. Similarly, in each of aberration patterns 3 to 9, the value of only one of terms C7, C8, C10, C11, C14, C15, C30, and C31 is set to 15 mλ, and those of other terms are set to zero.

TABLE 1

|  | Term C7 | Term C8 | Term C10 | Term C11 | Term C14 | Term C15 | Term C30 | Term C31 | Other Terms |
|---|---|---|---|---|---|---|---|---|---|
| Aberration Pattern 1 | 0 | 0 | 0 | 0 | 0 | 0 | 0 | 0 | 0 |
| Aberration Pattern 2 | 15 | 0 | 0 | 0 | 0 | 0 | 0 | 0 | 0 |
| Aberration Pattern 3 | 0 | 15 | 0 | 0 | 0 | 0 | 0 | 0 | 0 |
| Aberration Pattern 4 | 0 | 0 | 15 | 0 | 0 | 0 | 0 | 0 | 0 |
| Aberration Pattern 5 | 0 | 0 | 0 | 15 | 0 | 0 | 0 | 0 | 0 |
| Aberration Pattern 6 | 0 | 0 | 0 | 0 | 15 | 0 | 0 | 0 | 0 |
| Aberration Pattern 7 | 0 | 0 | 0 | 0 | 0 | 15 | 0 | 0 | 0 |
| Aberration Pattern 8 | 0 | 0 | 0 | 0 | 0 | 0 | 15 | 0 | 0 |
| Aberration Pattern 9 | 0 | 0 | 0 | 0 | 0 | 0 | 0 | 15 | 0 |

In the Zernike polynomials, terms C7, C8, C10, C11, C14, C15, C30, and C31 correspond to coma aberrations. Coma aberrations are generally known to influence shifts in edge position of the optical image. In this embodiment, each of a plurality of aberration patterns is determined so as to include at least a coma aberration, thereby making it possible to obtain an effective light source which suppresses shifts in edge position of the optical image due to all types of aberrations including coma aberrations.

Although an aberration pattern having a specific value for only a specific Zernike term is set in this embodiment, that measured by an actual exposure apparatus (projection optical system) may be set intact. Also, in one aberration pattern, nonzero values may be set as the values of a plurality of Zernike terms, and a negative value may even be set as the value of a specific Zernike term. Although nine aberration patterns are set in this embodiment, any number of aberration patterns may be set.

In step S112, an optical image (its intensity distribution) of the mask pattern, which is formed when each of the plurality of aberration patterns set in step S110 is produced in the projection optical system, is calculated for each of the plurality of element light sources generated in step S108. More specifically, one aberration pattern selected from the plurality of aberration patterns set in step S110 is produced in the projection optical system. An optical image of the mask pattern, which is formed on the cutline set in step S104 when the mask pattern is illuminated with one element light source selected from the plurality of element light sources generated in step S108, is then calculated. This process is done for all combinations of the plurality of aberration patterns and the plurality of element light sources. In this embodiment, 813 element light sources are generated in step S108, and nine aberration patterns are set in step S110, so 813×9=7317 optical images are calculated.

Note that the optical image calculated in step S112 may take any form as long as it is linear with respect to the intensity of the element light source. For example, to obtain an image corresponding to a resist image, the optical image is often convolved with a Gaussian function (that is, a resist model describing the chemical and physical properties of a resist) describing diffusion of an acid in the resist. Such an image is also linear with respect to the intensity of the element light source, and is therefore included in the optical image in this embodiment. Also, such an optical image can be calculated using a commercially available optical simulator such as Prolith®.

In step S114, an effective light source is determined (optimized) based on the evaluation criterion set in step S106, and the optical images (their intensity distributions) calculated in step S112. More specifically, a weight (intensity) to be applied to each of the plurality of element light sources is determined such that the edge positions, on the cutline, of the optical images of the mask pattern come close to the target edge positions, thereby determining, as an effective light source, a light source obtained by combining the plurality of element light sources applied with the weights. In other words, the ratio between the intensities of the plurality of element light sources (the 813 element light sources in this embodiment) generated in step S108 is determined to determine an effective light source.

Although one type of mathematical programming, that is, linear programming is assumed to be used to determine (optimize) an effective light source in this embodiment, this is not intended to limit the technique of optimizing the effective light source, and the Monte Carlo method or the downhill simplex method, for example, may be employed. In linear programming, an objective function to be minimized (or maximized) is set, and a condition to be satisfied, which defines the relationship between the variables, are set as a constraint, thereby making it possible to optimize the effective light source using a commercially available solver such as CPLEX®. In this embodiment, an equation describing the maximum amount of edge shift (evaluation criterion), for example, is set as an objective function. Also, an equation which associates the intensity (variable) of each of the 813 element light sources, the optical image of the mask pattern, and the maximum amount of edge shift with each other, and an equation (for example, an equation describing that the intensity needs to have a value of zero or more) which limits the intensity of each of these element light sources are set as constraints.

Figure 6:
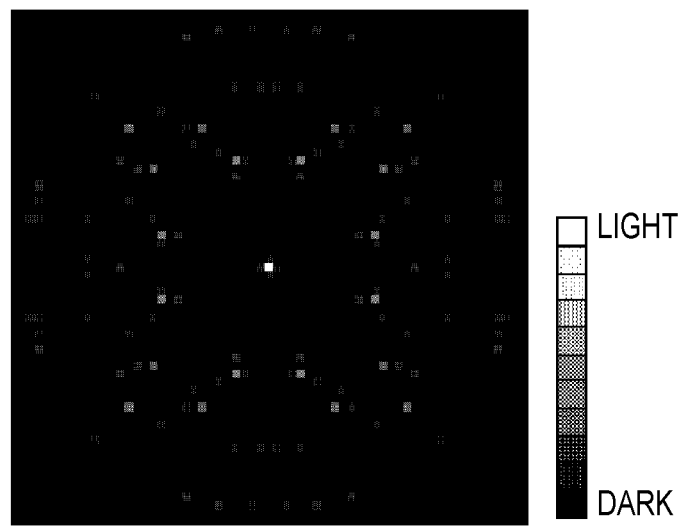
FIG. 6 is a view showing an effective light source determined in step S114 of the flowchart shown in FIG. 1.

In this embodiment, an optimization result (the intensities (light emission intensities shown in Table 2) of the 813 element light sources (light source numbers shown in Table 2)) shown in Table 2 was obtained. Note that Table 2 does not show element light sources which have zero intensity (that is, which are not illuminated). An effective light source, as shown in FIG. 6, is obtained by multiplying the plurality of element light sources generated in step S108 by the intensities, respectively, shown in Table 2, and combining these plurality of element light sources.

TABLE 2

| Light Source Number | Light Emission Intensity |
|---|---|
| 19 | 0.04031 |
| 23 | 0.08779 |
| 36 | 0.02424 |
| 38 | 0.00513 |
| 40 | 0.11775 |
| 47 | 0.01859 |
| 144 | 0.04873 |
| 147 | 0.03888 |
| 149 | 0.02300 |
| 187 | 0.02947 |
| 224 | 0.01215 |
| 228 | 0.07952 |
| 254 | 0.00210 |
| 275 | 0.18360 |
| 277 | 0.05202 |
| 279 | 0.00479 |
| 284 | 0.15958 |
| 306 | 0.00431 |
| 331 | 0.03336 |
| 356 | 0.03501 |
| 362 | 0.01975 |
| 382 | 0.04348 |
| 383 | 0.26253 |
| 397 | 0.11873 |
| 398 | 0.02053 |
| 422 | 0.14640 |
| 424 | 0.10656 |
| 442 | 0.10257 |
| 485 | 0.00119 |
| 496 | 0.09308 |
| 514 | 0.00797 |
| 546 | 0.06936 |
| 557 | 0.07521 |
| 605 | 0.06265 |
| 613 | 0.04302 |
| 619 | 0.04809 |
| 620 | 0.07235 |
| 665 | 0.11701 |
| 667 | 0.21523 |
| 676 | 0.00508 |
| 699 | 0.04104 |
| 745 | 0.01008 |
| 747 | 0.00222 |
| 750 | 0.07430 |
| 772 | 0.04820 |
| 782 | 0.57430 |
| 783 | 0.07430 |
| 800 | 0.11181 |

Figure 7:
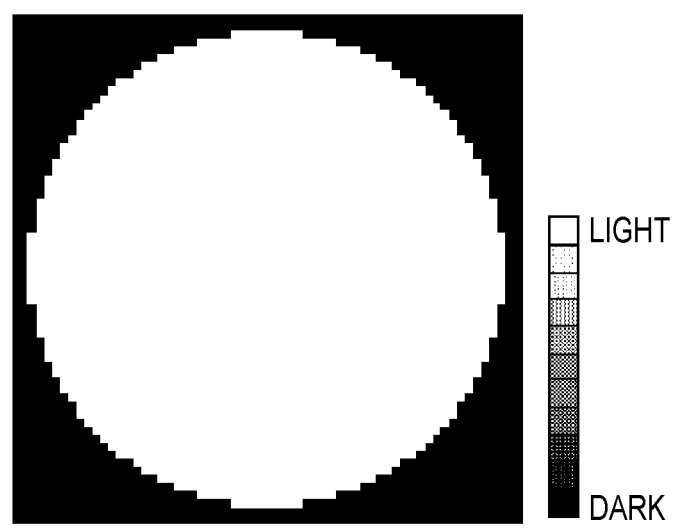
FIG. 7 is a view showing an effective light source generally used for the mask pattern shown in FIG. 2.

An effective light source with a large sigma value (a sigma value=0.93), as shown in FIG. 7, is generally used for the mask pattern shown in FIG. 2 (a mask pattern used for an SRAM well process). Hence, the fact that the effective light source shown in FIG. 6 (an effective light source according to this embodiment) achieves an image performance superior to that shown in FIG. 7 (an effective light source according to the prior art technique) will be explained hereinafter.

Figure 8:
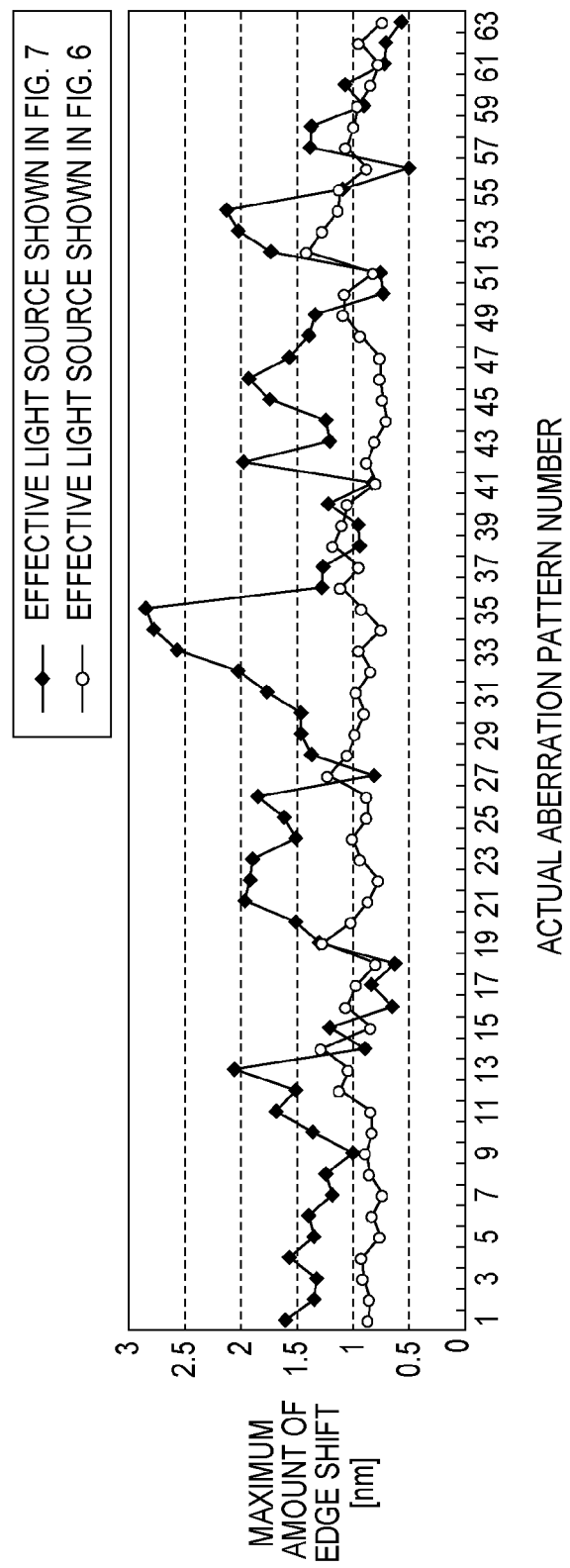
FIG. 8 is a graph showing the simulation results obtained when 63 actual aberration patterns are produced in a projection optical system, and the mask pattern shown in FIG. 2 is illuminated with the effective light sources shown in FIGS. 6 and 7.

First, to examine whether shifts in edge position of the optical image due to all types of aberrations is suppressed, aberrations were measured using an actual exposure apparatus (projection optical system) to obtain 63 actual aberration patterns. FIG. 8 illustrates the simulation results obtained when the 63 actual aberration patterns are produced in the projection optical system, and the mask pattern shown in FIG. 2 (the mask pattern set in step S102) is illuminated with the effective light sources shown in FIGS. 6 and 7. FIG. 8 shows the maximum amount of edge shift serving as an evaluation criterion on the ordinate, and the number of each actual aberration pattern on the abscissa.

Referring to FIG. 8, in some actual aberration patterns, the effective light source shown in FIG. 7 has a maximum amount of edge shift smaller than that of the effective light source shown in FIG. 6. However, as can be seen from FIG. 8, in most actual aberration patterns, the effective light source shown in FIG. 6 has a maximum amount of edge shift smaller than that of the effective light source shown in FIG. 7. FIG. 8 also reveals that the robustness is better in the effective light source shown in FIG. 6 than in that shown in FIG. 7. The effective light source shown in FIG. 7 has very large maximum amounts of edge shift for specific actual aberration patterns (for example, actual aberration pattern 35), whereas that shown in FIG. 6 has maximum amounts of edge shift, which are kept small for all of the 63 actual aberration patterns. In this way, in this embodiment, an effective light source capable of suppressing shifts in edge position of the optical image due to various types of aberrations which are expected to exist in the projection optical system can be determined.

<Second Embodiment>

In the first embodiment, an effective light source capable of suppressing shifts in edge position of the optical image even if aberrations exist in the projection optical system when an ideal focus position, that is, a best focus position is ensured is obtained. However, in the actual fabrication of a semiconductor device, defocus (a shift from the image plane of the projection optical system) may occur to a non-negligible extent at the time of exposure. Hence, in this embodiment, an effective light source is determined in consideration of defocus as well.

More specifically, a plurality of defocus planes are set, and an optical image of the mask pattern, which is formed at a position corresponding to the cutline, is calculated for each of the plurality of defocus planes in step S112. Setting target edge positions for the edge positions of the respective optical images then makes it possible to optimize the effective light source while taking defocus into consideration.

In this embodiment, a plane (that is, a best focus plane) having zero defocus from the image plane of the projection optical system, and that having an amount of defocus of 100 nm from the image plane of the projection optical system are set as a plurality of defocus planes, and optical images formed on the respective planes are calculated. When the above-mentioned position (value) is set as a target edge position, an effective light source, as shown in FIG. 9, is obtained.

Figure 9:
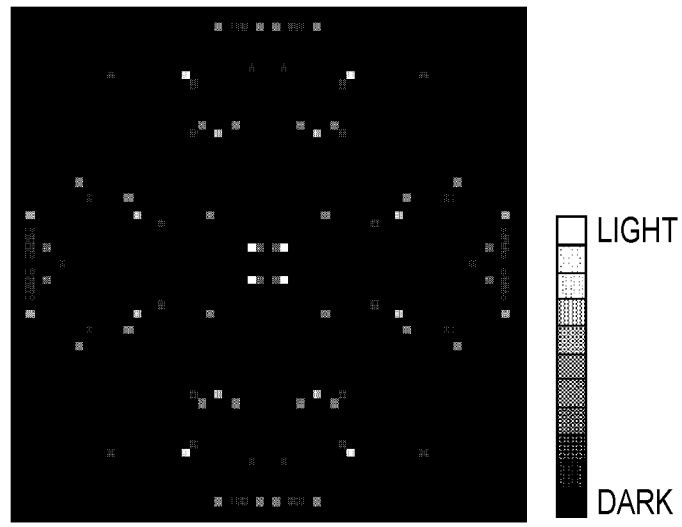
FIG. 9 is a view showing an effective light source determined in step S114 of the flowchart shown in FIG. 1.
Figure 10:
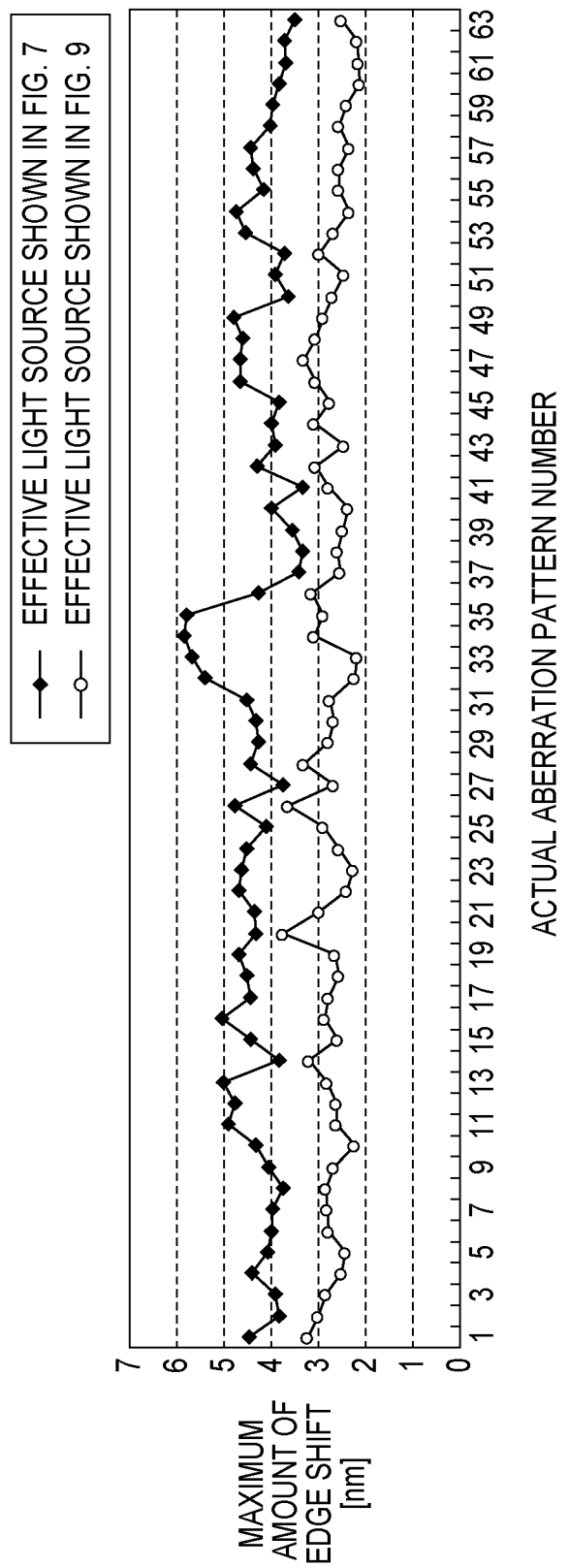
FIG. 10 is a graph showing the simulation results obtained when 63 actual aberration patterns are produced in a projection optical system, and the mask pattern shown in FIG. 2 is illuminated with the effective light sources shown in FIGS. 9 and 7.

The image performance of the effective light source shown in FIG. 9 (an effective light source according to this embodiment), and that of the effective light source shown in FIG. 7 (an effective light source according to the prior art technique) were compared with each other, as in the first embodiment. FIG. 10 illustrates the simulation results obtained when 63 actual aberration patterns identical to those used in the first embodiment are produced in the projection optical system, and the mask pattern shown in FIG. 2 (the mask pattern set in step S102) is illuminated with the effective light sources shown in FIGS. 9 and 7. FIG. 10 shows the maximum amount of edge shift serving as an evaluation criterion on the ordinate, and the number of each actual aberration pattern on the abscissa.

As can be seen from FIG. 10, in all the actual aberration patterns, the effective light source shown in FIG. 9 has a maximum amount of edge shift smaller than that of the effective light source shown in FIG. 7. In this way, in this embodiment, an effective light source capable of suppressing shifts in edge position of the optical image due to various types of aberrations which are expected to exist in the projection optical system can be determined while taking defocus into consideration.

Although two defocus planes: a plane having zero defocus, and that having an amount of defocus of 100 nm are set in this embodiment, any number of defocus planes may be set. Also, interpolating and extrapolating the calculated data of the optical image for each of the plurality of defocus planes makes it possible to optimize the effective light source while taking defocus into consideration, without directly calculating the optical images.

<Third Embodiment>

In the first embodiment, an effective light source capable of suppressing shifts in edge position of the optical image even if aberrations exist in the projection optical system when an ideal amount of exposure (dose) at the time of exposure is ensured is obtained. However, in the actual fabrication of a semiconductor device, a shift in amount of exposure from an ideal amount may occur to a non-negligible extent. Hence, in this embodiment, an effective light source is determined in consideration of the amount of exposure (its fluctuation) as well.

More specifically, an element light source for intensity evaluation, which is obtained by setting a plurality of different intensities to each of a plurality of element light sources, is generated for each of the plurality of element light sources (that is, the intensities of the element light sources are proportionally multiplied by a given factor to generate element light sources for intensity evaluation). Also, in step S112, and an optical image of the mask pattern, which is formed at a position corresponding to the cutline, is calculated for each of the element light sources for intensity evaluation. Setting target edge positions for the edge positions of the respective optical images then makes it possible to optimize the effective light source while taking the amount of exposure into consideration.

Figure 11:
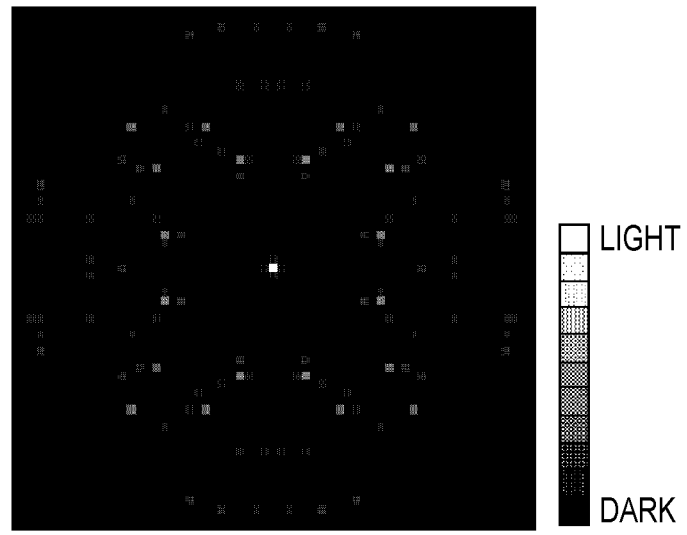
FIG. 11 is a view showing an effective light source determined in step S114 of the flowchart shown in FIG. 1.

In this embodiment, element light sources for intensity evaluation are set for an ideal amount of exposure, an amount of exposure that is −5% of the ideal amount, and an amount of exposure that is +5% of the ideal amount, and optical images for the respective element light sources for intensity evaluation are calculated. When the above-mentioned position (value) is set as a target edge position, an effective light source, as shown in FIG. 11, is obtained. Note that the effective light source shown in FIG. 11 is different from that shown in FIG. 6, although it is difficult to distinguish between them.

The image performance of the effective light source shown in FIG. 11 (an effective light source according to this embodiment), and that of the effective light source shown in FIG. 7 (an effective light source according to the prior art technique) were compared with each other, as in the first and second embodiments. FIG. 12 illustrates the simulation results obtained when 63 actual aberration patterns identical to those used in the first embodiment are produced in the projection optical system, and the mask pattern shown in FIG. 2 (the mask pattern set in step S102) is illuminated with the effective light sources shown in FIGS. 11 and 7. FIG. 12 shows the maximum amount of edge shift serving as an evaluation criterion on the ordinate, and the number of each actual aberration pattern on the abscissa.

Referring to FIG. 12, in some actual aberration patterns, the effective light source shown in FIG. 7 has a maximum amount of edge shift smaller than that of the effective light source shown in FIG. 11. However, as can be seen from FIG. 12, in most actual aberration patterns, the effective light source shown in FIG. 11 has a maximum amount of edge shift smaller than that of the effective light source shown in FIG. 7.

FIG. 12 also reveals that the robustness is better in the effective light source shown in FIG. 11 than in that shown in FIG. 7. The effective light source shown in FIG. 7 has very large maximum amounts of edge shift for specific actual aberration patterns (for example, actual aberration pattern 35), whereas that shown in FIG. 11 has maximum amounts of edge shift, which are kept small for all of the 63 actual aberration patterns. In this way, in this embodiment, an effective light source capable of suppressing shifts in edge position of the optical image due to various types of aberrations which are expected to exist in the projection optical system can be determined while taking the amount of exposure into consideration.

Although element light sources for intensity evaluation are set for three amounts of exposure: an ideal amount of exposure, an amount of exposure that is −5% of the ideal amount, and an amount of exposure that is +5% of the ideal amount, any number of amounts of exposure may be set. Also, interpolating and extrapolating the calculated data of the optical image for each of the plurality of element light sources for intensity evaluation makes it possible to optimize the effective light source while taking the amount of exposure into consideration, without directly calculating the optical images.

<Fourth Embodiment>

In the second and third embodiments, an effective light source capable of suppressing shifts in edge position of the optical image even if aberrations exist or fluctuate in the projection optical system is obtained while taking defocus or the amount of exposure into consideration. However, the physical quantities that can be evaluated in the present invention are limited to neither defocus nor the amount of exposure.

For example, in step S106, not only the maximum amount of edge shift but also ILS or NILS to serve as a general image performance may be set as an evaluation criterion. Note that ILS is an abbreviation for "Image Log Slope", and NILS is an abbreviation for "Normalized Image Log Slope". Again in step S106, an MSD (Moving Standard Deviation) which represents vibration of the mask stage or wafer stage of the exposure apparatus may be set as an evaluation criterion.

To take into account the influence (MEEF) of the image performance when a mask error occurs, the effective light source need only be optimized upon setting a mask pattern when a mask error occurs in step S102. Also, to take into account a plurality of resist models, it is only necessary to calculate optical images using a plurality of resist models to optimize the effective light source based on the calculated optical images in step S112.

In this manner, the present invention makes it possible to optimize the effective light source in consideration of various types of physical quantities, in addition to the maximum amount of edge shift, defocus, and the amount of exposure.

<Fifth Embodiment>

Figure 4B:
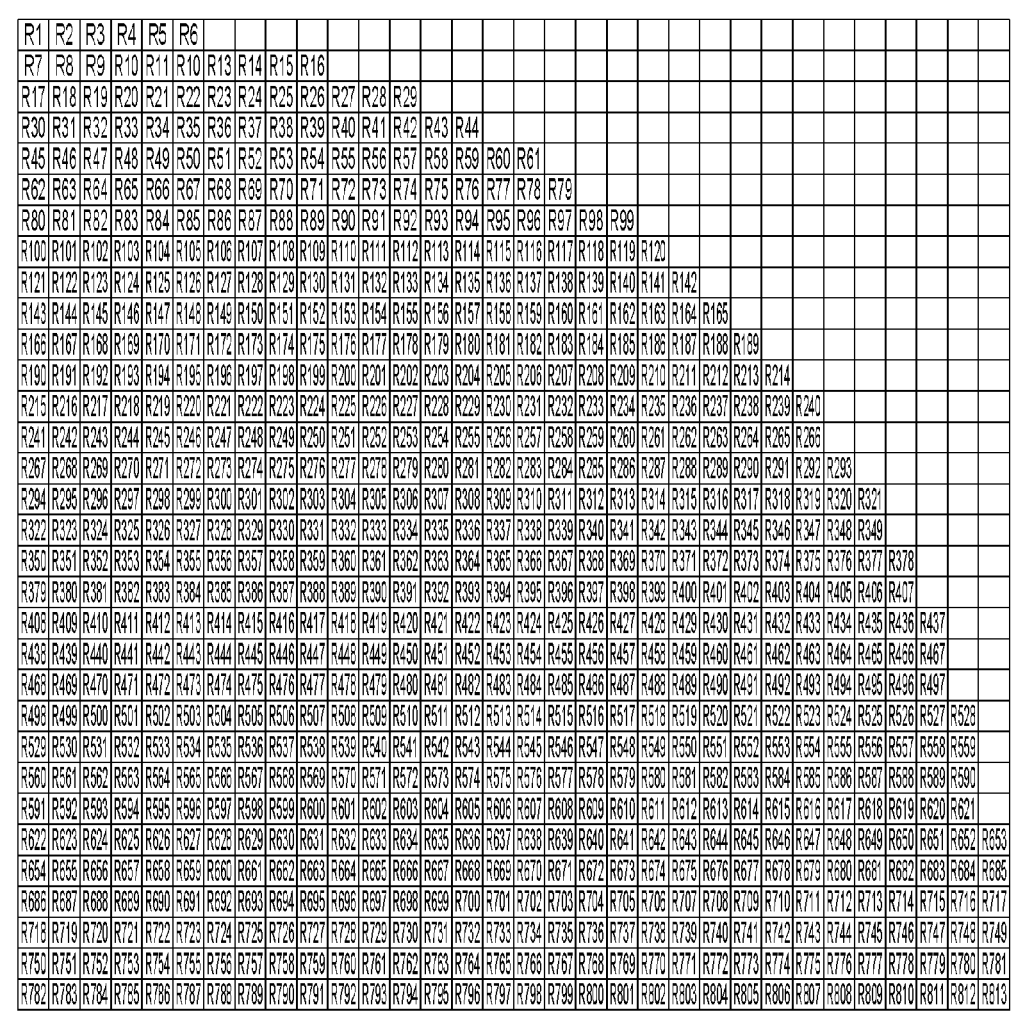

In the first to third embodiments, as shown in FIGS. 4A and 4B, a plurality of element light sources formed by illuminating a plurality of regions, respectively, obtained by dividing the pupil plane of the illumination optical system in a grid pattern are used, so the effective light source is optimized at a relatively large number of degrees of freedom. The use of a diffraction optical element such as a computer generated hologram (CGH) allows a variety of exposure apparatuses to implement (form) such an effective light source with a large number of degrees of freedom. However, not all types of exposure apparatuses can implement (form) an effective light source with a large number of degrees of freedom. An old-generation exposure apparatus which uses a KrF excimer laser as a light source, for example, may not be able to use a diffraction optical element. Also, it is often desirable not to use a diffraction optical element because it incurs a high manufacturing cost.

The illumination optical system of the exposure apparatus generally includes an optical element which determines the rough shape of an effective light source, such as a large-sigma, annular, or dipole shape, and adjusts this shape. For example, it is possible to adjust the sigma value for a large-sigma effective light source, and the outer and inner sigma values for an annular effective light source. Such effective light source adjustment can be done without manufacturing a new diffraction optical element (that is, this adjustment can be done in the exposure apparatus (illumination optical system)), thus entailing no additional cost. Therefore, it is often desirable to optimize the effective light source so that it falls within its adjustable range in the illumination optical system. Hence, in this embodiment, optimization of the outer and inner sigma values in an annular effective light source will be described as an example of effective light source optimization.

Figure 13A:
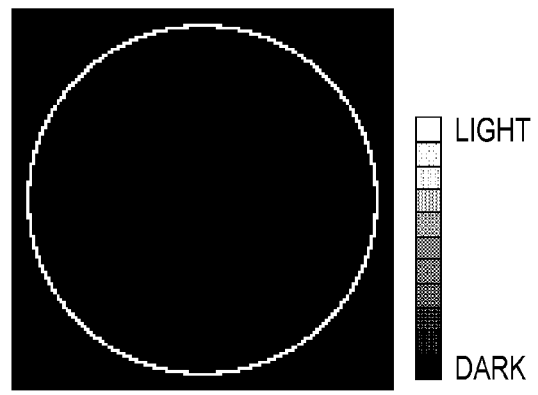
FIGS. 13A to 13C are views illustrating examples of a plurality of element light sources generated in step S108 of the flowchart shown in FIG. 1.
Figure 13B:
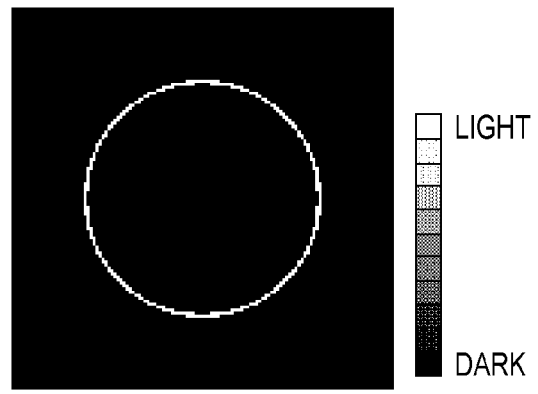
Figure 13C:
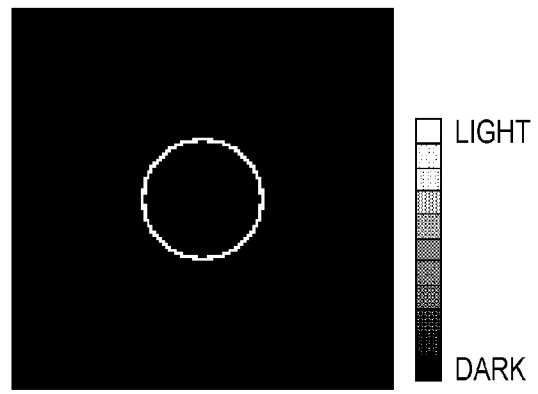
Figure 14:
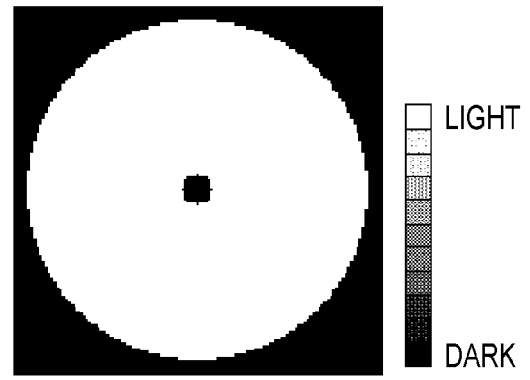
FIG. 14 is a view showing an effective light source determined in step S114 of the flowchart shown in FIG. 1.

In step S108, annular element light sources are generated as a plurality of element light sources, as shown in FIGS. 13A to 13C. FIG. 13A shows an element light source having an outer sigma value of 0.92 and an inner sigma value of 0.90. Also, FIG. 13B shows an element light source having an outer sigma value of 0.62 and an inner sigma value of 0.60, and FIG. 13C shows an element light source having an outer sigma value of 0.32 and an inner sigma value of 0.30. In this manner, an annular element light source having an annular zone width of 0.02 is generated to cover the pupil plane (that is, the entire effective light source region) of the illumination optical system, thereby making it possible to optimize the effective light source by limiting it to an annular shape. When the same mask pattern (the mask pattern shown in FIG. 2), target edge positions, evaluation criterion, etc. as in the first embodiment are set, an effective light source, as shown in FIG. 14, was obtained. The effective light source shown in FIG. 14 has an annular shape having an outer sigma value of 0.92 and an inner sigma value of 0.08.

<Sixth Embodiment>

Figure 15:
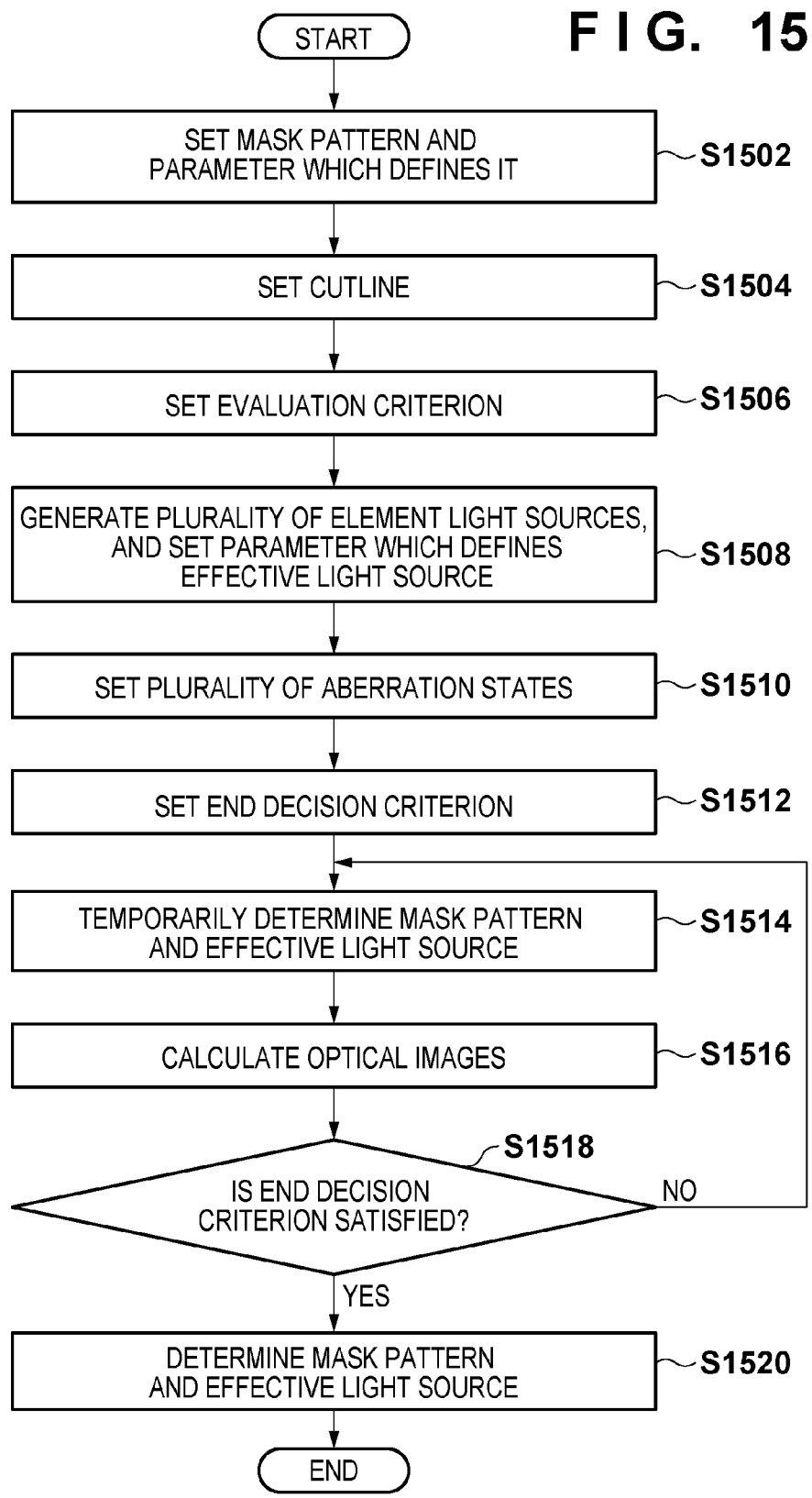
FIG. 15 is a flowchart for explaining a determination method according to another aspect of the present invention.

In the first to fifth embodiments, the effective light source is optimized upon setting (fixing) a mask pattern. However, it is often desirable to optimize the mask pattern, together with the effective light source. Hence, in this embodiment, optimization of not only the effective light source but also the mask pattern will be described with reference to FIG. 15.

In step S1502, a mask pattern and a parameter (variables) which defines it are set. Note that the mask pattern set in step S1502 is optimized (deformed) in a step to be described later, and is therefore the temporary pattern of the mask, unlike the mask pattern set in step S102.

In this embodiment, a mask pattern including a pattern group PTA formed from light-shielding portions (transmittance: 0%), and a background portion BCA formed from a light-transmitting portion (transmittance: 100%) is set, as shown in FIG. 16. This mask pattern is designed as a one-dimensional line-and-space pattern, and includes 13 patterns PTA1 to PTA13. Also, the line width W(PTAn)) and midpoint position (midpoint coordinate) XC(PTAn) of a pattern PTAn (n: integers of 1 to 13) are set as parameters which define the shape of the mask pattern to obtain variables which fall within the following ranges:

W(PTA1)=235 to 245 nm
W(PTA2)=235 to 245 nm
W(PTA3)=235 to 245 nm
W(PTA4)=235 to 245 nm
W(PTA5)=235 to 245 nm
W(PTA6)=235 to 245 nm
W(PTA7)=235 to 245 nm
XC(PTA1)=−3605 to −3595 nm
XC(PTA2)=−3005 to −2995 nm
XC(PTA3)=−2405 to −2395 nm
XC(PTA4)=−1805 to −1795 nm
XC(PTA5)=−1205 to −1195 nm
XC(PTA6)=−605 to −595 nm
XC(PTA7)=0 nm (fixed)

Note that the line width and midpoint position are defined in a coordinate system (see FIG. 16) on the image plane of the projection optical system. Although only the ranges of line widths and midpoint positions of the patterns PTA1 to PTA7 are shown herein, those of all the patterns PTA1 to PTA13 are set in practice. More specifically, as the ranges of line widths and midpoint positions of the patterns PTA8 to PTA13, those corresponding to the patterns PTA6 to PTA1, respectively, are set based on the symmetry of the mask pattern. Also, in this embodiment, not only the mask pattern shown in FIG. 16 but also the mask pattern obtained by rotating that shown in FIG. 16 through 90° (that is, obtained by interchanging the ordinate and the abscissa in the former mask pattern) is set as well. As the ranges of line widths and midpoint positions of 13 patterns included in the mask pattern obtained by rotating that shown in FIG. 16 through 90°, those corresponding to the patterns PTA1 to PTA13 are set.

Although parameters (the line widths and midpoint positions) which define the shape of the mask pattern are set as parameters which define the mask pattern in this embodiment, those which define the phase or transmittance of the mask pattern can also be set.

In step S1504, as in step S104, a cutline (evaluation areas) used to evaluate an optical image (an image formed on the image plane of the projection optical system) of the mask pattern set in step S1502 is set.

In step S1506, an evaluation criterion used to evaluate the optical image of the mask pattern is set. In this embodiment, the maximum amount of edge shift in the mask pattern shown in FIG. 16 is set as an evaluation criterion, like step S106.

In step S1508, a plurality of different element light sources formed on the pupil plane of the illumination optical system are generated, and a parameter which defines the effective light source is set. In this embodiment, the pupil plane of the illumination optical system is divided into 15×15 regions in a grid pattern, and the respective regions are illuminated to generate them as a plurality of element light sources, as shown in FIG. 17. Note that regions R1 to R52 (that is, the upper right quarter) shown in FIG. 17, among the regions obtained by dividing the pupil plane of the illumination optical system, need only be evaluated because of the symmetry of the effective light source. Also, a light intensity (weight) to be applied to each of the regions R1 to R52 shown in FIG. 17 is set as a parameter which defines the effective light source.

In step S1510, a plurality of different aberration states (a plurality of different aberration patterns produced in the projection optical system) which are expected to exist in the projection optical system are set. In this embodiment, nine aberration patterns (aberration patterns shown in Table 1) identical to those used in the first embodiment are set.

In step S1512, an end decision criterion used to decide whether to end optimization of the effective light source and mask pattern is set. In this embodiment, a threshold (that is, an allowable maximum amount of edge shift) for the maximum amount of edge shift set as an evaluation criterion in step S1506 is set as an end decision criterion. However, the end decision criterion is not limited to the threshold for the maximum amount of edge shift, and a limit count which limits the number of times of calculation of optical images (that is, the number of repetitions of optimization), for example, may be set.

In step S1514, a mask pattern and an effective light source are temporarily determined based on the evaluation criterion set in step S1506. In this embodiment, a parameter which defines the mask pattern and that which defines the effective light source are temporarily determined using the downhill simplex method. More specifically, an interval including, as a parameter group, the parameter which defines the mask pattern and is set in step S1502, and that which defines the effective light source and is set in step S1508 are set to determine the value of each parameter in a space defined in this interval. The value of each parameter is temporarily determined by random numbers in the beginning of calculation, but step S1514 is generally performed a plurality of times, as will be described later. In calculation operations subsequent to the first calculation operation, an algorithm which uses the downhill simplex method is set to temporarily determine the value of each parameter so that the threshold serving as the evaluation criterion set in step S1506 becomes as small as possible.

In step S1516, optical images of the mask pattern, which are formed on the image plane of the projection optical system, are calculated using the plurality of aberration patterns set in step S1510, and the mask pattern and effective light source temporarily determined in step S1514, which is executed a plurality of times. More specifically, optical images of the mask pattern, which are formed on the cutline set in step S1504 when a plurality of aberration patterns 1 to 9 are produced in the projection optical system, and the temporarily determined mask pattern is illuminated with the temporarily determined effective light source, are calculated. In this embodiment, nine aberration patterns are set in step S1510, so nine optical images are calculated.

In step S1518, it is determined whether the end decision criterion set in step S1512 is satisfied, based on the optical images calculated in step S1516. If NO is determined in step S1518, the process returns to step S1514, in which a mask pattern and an effective light source are temporarily determined again. In this manner, steps S1514 to S1518 are iterated, thereby determining a final mask pattern and effective light source. On the other hand, if YES is determined in step S1518, the process advances to step S1520.

In this embodiment, it is determined whether the maximum amount of edge shift satisfies the threshold, for all of the nine optical images calculated in step S1516. If even one of the nine optical images has a maximum amount of edge shift which does not satisfy the threshold, it is determined in step S1518 that the end decision reference is not satisfied.

In step S1520, the mask pattern and effective light source temporarily determined in step S1514 are determined as a final mask pattern and effective light source, respectively. Note that in step S1514, a weight to be applied to each of the plurality of element light sources set in step S1508 is temporarily determined, so an effective light source can be obtained by combining the plurality of element light sources applied with the weights. In this embodiment, an effective light source, as shown in FIG. 18, was obtained. Also, the following results were obtained for the mask pattern:

W(PTA1)=240.6 nm
W(PTA2)=240.6 nm
W(PTA3)=240.4 nm
W(PTA4)=240.2 nm
W(PTA5)=240.4 nm
W(PTA6)=241.0 nm
W(PTA7)=240.4 nm
XC(PTA1)=−3600.1 nm
XC(PTA2)=−3000.1 nm
XC(PTA3)=−2400.0 nm
XC(PTA4)=−1799.9 nm
XC(PTA5)=−1199.9 nm
XC(PTA6)=−599.9 nm
XC(PTA7)=0 nm (fixed)

Note that the parameters which define the mask pattern were optimized with a constraint so that they take values in steps of 0.1 nm, in consideration of the manufacturability of the mask.

Figure 19:
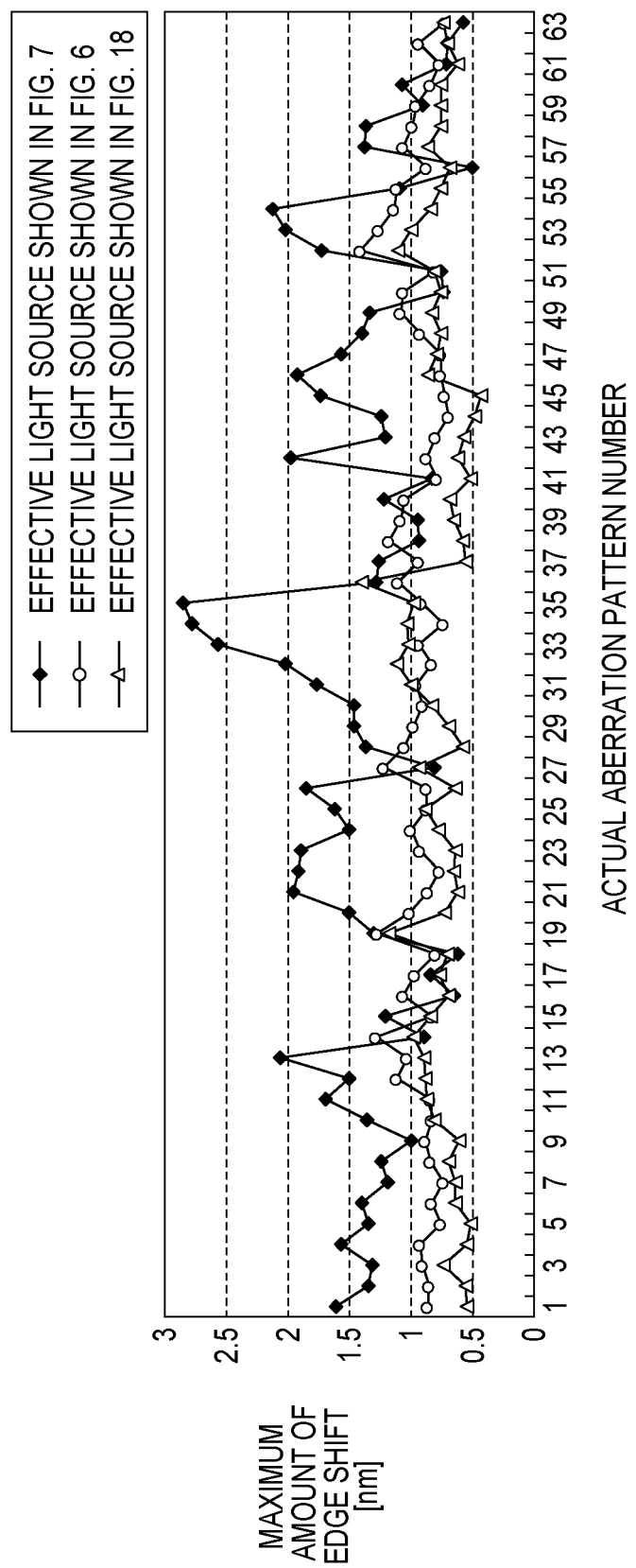
FIG. 19 is a graph showing the simulation results obtained when 63 actual aberration patterns are produced in a projection optical system, and the mask pattern is illuminated with the effective light sources shown in FIGS. 6, 7, and 18.

The image performance of the effective light source shown in FIG. 18, and that of the effective light source shown in FIG. 6 were compared with each other. FIG. 19 illustrates the simulation results obtained when 63 actual aberration patterns identical to those used in the first embodiment are produced in the projection optical system, and the mask pattern is illuminated with the effective light sources shown in FIGS. 18 and 6. Note that FIG. 19 illustrates the simulation result obtained when the mask pattern defined by the above-mentioned parameters is illuminated with the effective light source shown in FIG. 18, and that obtained when the mask pattern shown in FIG. 2 is illuminated with the effective light source shown in FIG. 6. FIG. 19 also illustrates the simulation result obtained when the mask pattern shown in FIG. 2 is illuminated with the effective light source shown in FIG. 7 (an effective light source according to the prior art technique). FIG. 19 shows the maximum amount of edge shift serving as an evaluation criterion on the ordinate, and the number of each actual aberration pattern on the abscissa.

As can be seen from FIG. 19, the effective light source shown in FIG. 18 has a maximum amount of edge shift smaller than that of the effective light source shown in FIG. 6. The number of divisions required to obtain element light sources is smaller in this embodiment than in the first embodiment, so the number of degrees of freedom of the effective light source is smaller in the former than in the latter. Nevertheless, in this embodiment, parameters which define the mask pattern are set as variables (that is, the mask pattern is optimized), so the effective light source has a large number of degrees of freedom as a whole. Thus, an effective light source and mask pattern which attain an image performance superior to that in the first embodiment can be obtained.

In this way, in this embodiment, not only an effective light source capable of suppressing shifts in edge position of the optical image due to various types of aberrations which are expected to exist in the projection optical system, but also a mask pattern suitable for this effective light source, can be determined.

The importance of evaluating shifts in edge position of the optical image due to various types of aberrations which are expected to exist in the projection optical system to determine (optimize) an effective light source, as has been described in the first to sixth embodiments, will be explained below with reference to FIGS. 20 and 21A to 21C.

Figure 20:
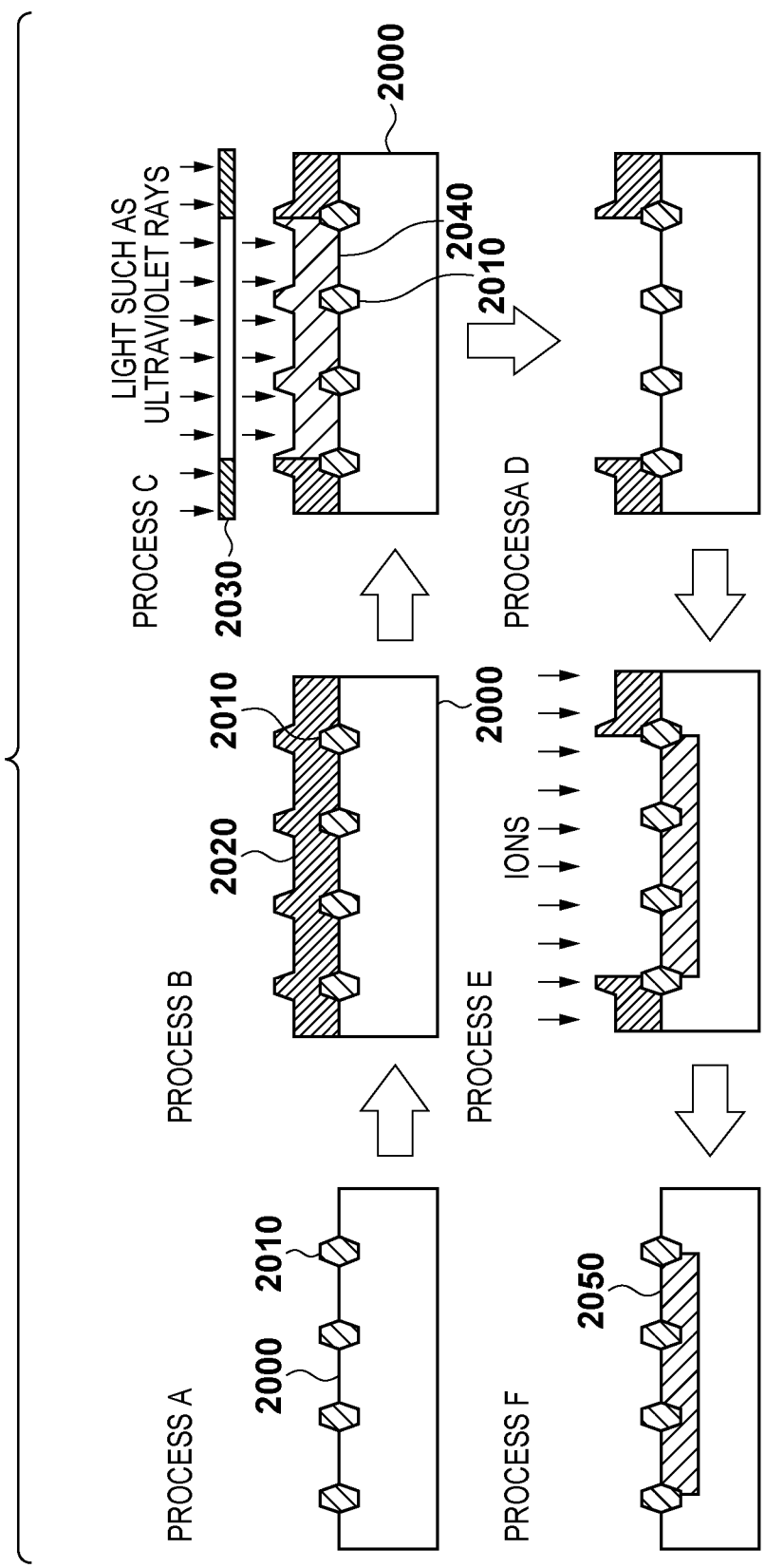
FIG. 20 is a flow diagram schematically showing the process flow in a typical well process of an SRAM memory cell.

FIG. 20 is a flow diagram schematically showing the process flow in a typical well process of an SRAM memory cell. The well process is a process for forming a region called a well. The necessity of controlling the edge positions of the optical image (that is, suppressing shifts in edge position) will be clarified with reference to FIG. 20. Although a process flow which uses a positive resist will be described herein, a negative resist may be employed.

First, in process A called an isolation process, isolation oxide films 2010 are formed on an Si wafer 2000 with predetermined spacings between them. Next, in process B, a resist 2020 is coated on the Si wafer 2000. In process C called a lithography process, the Si wafer 2000 is irradiated with light such as ultraviolet rays via a mask 2030. Thus, light which bears the information of the pattern of the mask 2030 is projected onto the Si wafer 2000 to expose a partial region 2040 of the resist 2020 on the Si wafer 2000 to light.

In process D called a development process, the partial region 2040 of the resist 2020 is dissolved and removed. In process E called an ion implantation process, specific ions accelerated in an electric field are implanted into the Si wafer 2000 using an ion implantation device. At this time, the ions are prevented from entering the interior of the wafer by the resist 2020, and are therefore implanted only into the opening in the wafer, that corresponds to the region from which the resist 2020 is removed. Note that the depth at which the ions are implanted into the wafer can be adjusted in accordance with the strength of the electric field which accelerates the ions. In process F, the entire resist 2020 is removed. The region into which the ions are implanted is called a well 2050. With a series of processes A to F, specific ions are implanted into regions defined between a plurality of isolation oxide films, so the electrical characteristics of a device can be controlled to preferable values. Note that the Si wafer 2000 and well 2050 have charges with opposite signs. Accordingly, when, for example, the Si wafer 2000 is of p-type, the well 2050 is of n-type.

Figure 21A:
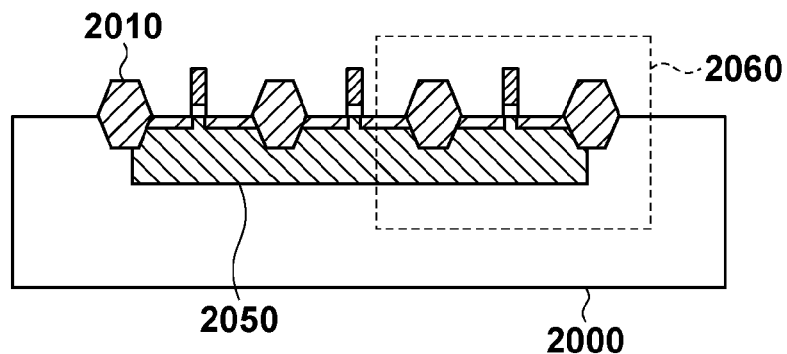
FIGS. 21A to 21C are views schematically showing the structures of wells and transistors.
Figure 21B:
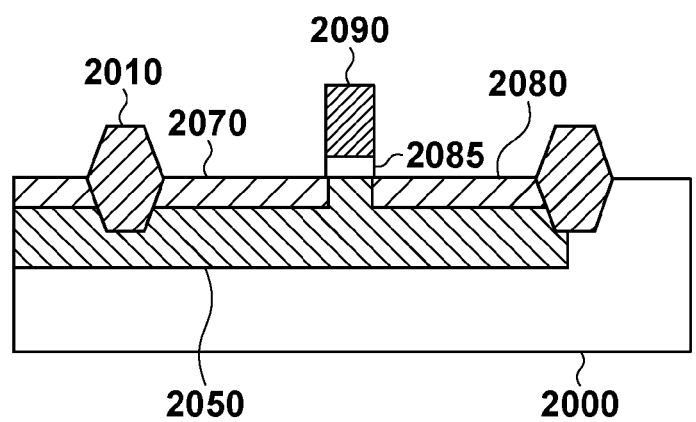
Figure 21C:
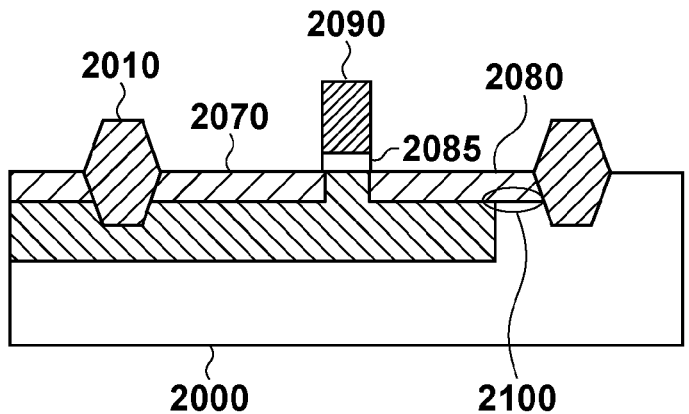

FIG. 21A is a view schematically showing the structure of the well 2050 and a transistor 2060. A plurality of transistors are formed in the well 2050 side by side, as shown in FIG. 21A. Attention is focused on the transistor 2060 formed at the end of the well 2050 among the plurality of transistors. In this case, FIGS. 21B and 21C show desirable and undesirable structures, respectively, of the transistor 2060. A source 2070, drain 2080, intergate oxide film 2085, and gate 2090 shown in FIG. 21B are formed after the well process.

Referring to FIG. 21B, the source 2070, drain 2080, and gate 2090 are formed on the well 2050. Therefore, the isolation oxide films 2010 isolate one transistor from portions other than the well 2050 on the Si wafer 2000, thus preventing leakage of the charges.

On the other hand, if the edge positions of the optical image in process C have low accuracy, the end of the well 2050 is formed at a position other than that on the isolation oxide film 2010 in the ion implantation process. As a result, when the source 2070 and drain 2080 are formed, the drain 2080 and a portion other than the well 2050 come into direct contact with each other in a region 2100, as shown in FIG. 21C. When the Si wafer 2000 is of p-type, whereas the well 2050 is of n-type, both the source 2070 and drain 2080 are of p-type. Therefore, in the region 2100, the charges easily leak because the Si wafer 2000 and drain 2080 both having p-type are in contact with each other. It is obvious that leakage of the charges adversely affects the performance of the transistors. In this manner, as the accuracy of the edge positions of the optical image degrades, the yield of devices considerably deteriorates.

Although attention has been focused on the well process herein, an ion implantation process is iterated a plurality of times until a final device is completed. An ion implantation process is also used when, for example, a source and a drain are formed. In this ion implantation process as well, it is important to control the edge positions of the optical image with high accuracy, as a matter of course.

In this manner, to improve the yield of devices such as SRAMs, it is very important to control the edge positions of the optical image with high accuracy (that is, suppress shifts in edge position). However, if aberrations typified by coma aberrations exist in the projection optical system, the edge positions of the optical image significantly fluctuate (shift), as described above. Therefore, as in this embodiment, it is advantageous to evaluate shifts in edge position of the optical image due to various types of aberrations which are expected to exist in the projection optical system to determine (optimize) an effective light source.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (for example, computer-readable medium).

<Seventh Embodiment>

Figure 22:
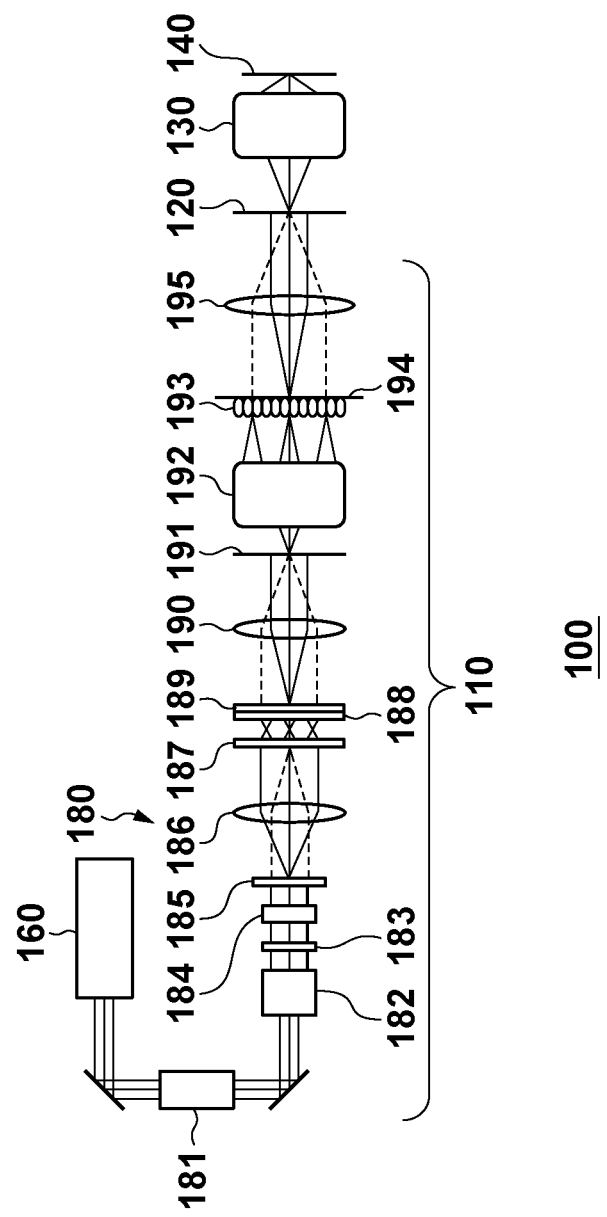
FIG. 22 is a schematic block diagram showing the arrangement of an exposure apparatus.

An exposure apparatus 100 which transfers the pattern of a mask illuminated with light from an illumination optical system onto a wafer will be described below with reference to FIG. 22. FIG. 22 is a schematic block diagram showing the arrangement of the exposure apparatus 100. The exposure apparatus 100 uses an illumination optical system 180 to form an effective light source determined by the above-mentioned determination method to illuminate the mask with the effective light source. Although the exposure apparatus 100 is of the step-and-scan type in this embodiment, it can also adopt the step-and-repeat type or another exposure type.

The exposure apparatus 100 includes an illumination device 110, a mask stage (not shown) which supports a mask 120, a projection optical system 130, and a wafer stage (not shown) which supports a wafer 140.

The illumination device 110 includes a light source 160 and the illumination optical system 180, and illuminates the mask 120 on which a circuit pattern to be transferred is formed. An excimer laser such as an ArF excimer laser having a wavelength of about 193 nm or a KrF excimer laser having a wavelength of about 248 nm, for example, is used as the light source 160. However, the types and number of light sources 160 are not particularly limited, and an $F_2$ laser having a wavelength of about 157 nm or a narrowband mercury lamp, for example, can also be used as the light source 160. The illumination optical system 180 illuminates the mask 120 with light from the light source 160, and forms an effective light source determined by the above-mentioned determination method. The illumination optical system 180 includes a routing optical system 181, beam shaping optical system 182, polarization control unit 183, phase control unit 184, exit angle control optical element 185, relay optical system 186, and multibeam generation unit 187. The illumination optical system 180 also includes a polarization state adjusting unit 188, computer generated hologram 189, relay optical system 190, aperture 191, zoom optical system 192, multibeam generation unit 193, aperture stop 194, and irradiation unit 195.

The routing optical system 181 deflects the light from the light source 160 to guide it to the beam shaping optical system 182. The beam shaping optical system 182 converts the aspect ratio of the cross-sectional shape of the light from the light source 160 into a predetermined value (converts this cross-sectional shape, for example, from a rectangle into a square). The beam shaping optical system 182 forms a light beam having a size and an angle of divergence that are required to illuminate the multibeam generation unit 187.

The polarization control unit 183 uses, for example, a linear polarizer, and has a function of eliminating unnecessary polarized components. Minimizing the polarized components eliminated (shielded) by the polarization control unit 183 makes it possible to efficiently convert the light from the light source 160 into predetermined linearly polarized light. The phase control unit 184 generates a phase difference of $\lambda/4$ in the light, which is linearly polarized by the polarization control unit 183, to convert it into circularly polarized light. The exit angle control optical element 185 uses, for example, an optical integrator (for example, a fly-eye lens or fiber formed from a plurality of microlenses), and outputs the light at a predetermined angle of divergence. The relay optical system 186 focuses the light emerging from the exit angle control optical element 185 on the multibeam generation unit 187. The exit surface of the exit angle control optical element 185 and the incident surface of the multibeam generation unit 187 have a Fourier transform relationship (serve as an object plane and a pupil plane, respectively, or serve as a pupil plane and an image plane, respectively) by means of the relay optical system 186. The multibeam generation unit 187 uses an optical integrator used to uniformly illuminate the polarization state adjusting unit 188 and computer generated hologram 189. A secondary light source formed from a plurality of point light sources is formed on the exit surface of the multibeam generation unit 187. The light emerging from the multibeam generation unit 187 enters the polarization state adjusting unit 188 as circularly polarized light.

The polarization state adjusting unit 188 generates a phase difference of $\lambda/4$ in the light, which is circularly polarized by the phase control unit 184, to convert it into linearly polarized light having a predetermined polarization direction. The light emerging from the polarization state adjusting unit 188 impinges on the computer generated hologram 189 which functions as a diffraction optical element. Although the polarization state adjusting unit 188 is placed on the light source side with respect to the computer generated hologram 189 in this embodiment, the polarization state adjusting unit 188 and the computer generated hologram 189 may be interchanged with each other. Also, when the polarization state adjusting unit 188 uses an SWS (Sub-Wavelength Structure), it serves as a single device having the functions of both a polarization state adjusting unit and a diffraction optical element (that is, it integrates a diffraction optical element).

The computer generated hologram 189 forms an effective light source (light intensity distribution) determined by the above-mentioned determination method, such as an effective light source as shown in FIG. 6, at the position of the aperture 191 via the relay optical system 190. The computer generated hologram 189 can also form, for example, annular illumination and quadrupole illumination, and even implement, for example, tangential polarization and radial polarization in cooperation with the polarization state adjusting unit 188. A plurality of computer generated holograms 189 which form different effective light sources are placed on, for example, a switching unit such as a turret. A computer generated hologram 189 corresponding to an effective light source determined by the above-mentioned determination method is placed in the optical path of the illumination optical system 180, thereby making it possible to form various effective light sources.

The aperture 191 has a function of passing only the effective light source (light intensity distribution) formed by the computer generated hologram 189. The computer generated hologram 189 and the aperture 191 have a Fourier transform relationship. The zoom optical system 192 enlarges the effective light source formed by the computer generated hologram 189 to a predetermined magnification, and projects it onto the multibeam generation unit 193. The multibeam generation unit 193 is placed on the pupil plane of the illumination optical system 180, and forms, on its exit surface, a light source image (effective light source) corresponding to the light intensity distribution formed at the position of the aperture 191. In this embodiment, the multibeam generation unit 193 uses an optical integrator such as a fly-eye lens or a cylindrical lens array. Note that the aperture stop 194 is placed near the exit surface of the multibeam generation unit 193. The irradiation unit 195 includes, for example, a condenser optical system, and illuminates the mask 120 with the effective light source formed on the exit surface of the multibeam generation unit 193.

The mask 120 has a circuit pattern to be transferred onto the wafer 140, and may have, for example, a mask pattern determined by the above-mentioned determination method. The mask 120 is supported and driven by the mask stage (not shown). Light diffracted by the mask 120 is projected onto the wafer 140 via the projection optical system 130. Since the exposure apparatus 100 is of the step-and-scan type, it transfers the pattern of the mask 120 onto the wafer 140 by scanning them.

The projection optical system 130 projects the pattern of the mask 120 onto the wafer 140. A dioptric system, a catadioptric system, or a catoptric system can be used as the projection optical system 130.

The wafer 140 is a substrate onto which the pattern of the mask 120 is to be projected (transferred), and is supported and driven by the wafer stage (not shown). However, the wafer 140 can also be substituted by a glass plate or another substrate. The wafer 140 is coated with a resist.

In exposure, light from the light source 160 illuminates the mask 120 by means of the illumination optical system 180. The light which bears the information of the pattern of the mask 120 forms an image on the wafer 140 by means of the projection optical system 130. At this time, the mask 120 is illuminated with an effective light source determined by the above-mentioned determination method. Hence, the exposure apparatus 100 can provide high-quality devices (for example, a semiconductor device, an LCD device, an image sensing device (for example, a CCD), and a thin-film magnetic head) with a high throughput and good economic efficiency. These devices are fabricated through a step of exposing a substrate (for example, a wafer or glass plate) coated with a photoresist (sensitizer) by using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-217760 filed on Sep. 28, 2010, which is hereby incorporated by reference herein in its entirety.

What is claimed is:

1. A method of determining a light intensity distribution to be formed on a pupil plane of an illumination optical system that illuminates a mask of an exposure apparatus including the illumination optical system, and a projection optical system that projects a pattern of the mask onto a substrate, and setting the determined light intensity distribution to the illumination optical system of the exposure apparatus, the method comprising:

a pattern setting step of setting a pattern of a mask to be placed on an object plane of the projection optical system;

an evaluation area setting step of setting an evaluation area used to evaluate an optical image of the pattern of the mask set in the pattern setting step, which is formed on the image plane of the projection optical system;

a generating step of generating a plurality of element light sources formed on the pupil plane of the illumination optical system;

an aberration state setting step of setting a plurality of different aberration states that are expected to exist in the projection optical system;

a calculating step of calculating, for each of all combinations of the plurality of aberration states and the plurality of element light sources, the optical image of the pattern of the mask, which is formed in the evaluation area set in the evaluation area setting step when one aberration state selected from the plurality of aberration states set in the aberration state setting step is produced in the projection optical system, and the pattern of the mask is illuminated with one element light source selected from the plurality of element light sources generated in the generating step; and a determining step of determining, based on the optical images calculated in the calculating step, a weight to be applied to each of the plurality of element light sources so that an edge position, in the evaluation area, of each of the optical images of the pattern of the mask comes close to a target edge position, and determining, as the light intensity distribution to be formed on the pupil plane of the illumination optical system, a light source obtained by combining the plurality of element light sources applied with the weights, wherein the pattern setting step, the evaluation area setting step, the generating step, the aberration state setting step, the calculating step, and the determination step are performed by a computer.

2. The method according to claim 1, further comprising:

a defocus plane setting step of setting a plurality of defocus planes defocused from the image plane of the projection optical system, wherein, in the calculating step, the optical image of the pattern of the mask, which is formed at a position corresponding to the evaluation area set in the evaluation area setting step, is calculated for each of the plurality of defocus planes as well, and wherein, in the determining step, based on the optical image calculated for each of the plurality of defocus planes as well, a weight to be applied to each of the plurality of element light sources is determined so that an edge position, in the evaluation area, of each of the optical images of the pattern of the mask comes close to a target edge position, and determining, as a light intensity distribution to be formed on the pupil plane of the illumination optical system, a light source obtained by combining the plurality of element light sources applied with the weights.

3. The method according to claim 1, wherein:

the generating step includes generating element light sources for intensity evaluation, which are obtained by proportionally multiplying intensities of the plurality of element light sources by a given factor, in the calculating step, the optical image of the pattern of the mask, which is formed at a position corresponding to the evaluation area set in the evaluation area setting step, is calculated for each of the element light sources for intensity evaluation as well, and in the determining step, based on the optical image calculated for each of the element light sources for intensity evaluation as well, a weight to be applied to each of the plurality of element light sources is determined so that an edge position, in the evaluation area, of each of the optical images of the pattern of the mask comes close to a target edge position, and determining, as a light intensity distribution to be formed on the pupil plane of the illumination optical system, a light source obtained by combining the plurality of element light sources applied with the weights.

4. The method according to claim 1, wherein, in the determining step, mathematical programming is used to determine a light intensity distribution to be formed on the pupil plane of the illumination optical system so that an edge position, in the evaluation area, of each of the optical images of the pattern of the mask comes close to a target edge position.

5. The method according to claim 1, wherein, in the aberration state setting step, each of the plurality of aberration states is set so as to include at least a coma aberration.

6. The method according to claim 1, wherein the pattern of the mask includes a pattern of a mask used for an ion implantation process.

7. A method of determining a pattern of a mask used in an exposure apparatus including an illumination optical system that illuminates the mask, and a projection optical system that projects the pattern of the mask onto a substrate, and a light intensity distribution to be formed on a pupil plane of the illumination optical system, setting the mask having the determined pattern in the exposure apparatus, and setting the determined light intensity distribution to the illumination optical system of the exposure apparatus, the method comprising:

a pattern setting step of setting a temporary pattern of a mask to be placed on an object plane of the projection optical system;

an evaluation area setting step of setting an evaluation area used to evaluate an optical image of the temporary pattern of the mask set in the pattern setting step, which is formed on the image plane of the projection optical system;

a generating step of generating a plurality of element light sources formed on the pupil plane of the illumination optical system;

an aberration state setting step of setting a plurality of different aberration states that are expected to exist in the projection optical system;

a calculating step of calculating, for each of all combinations of the plurality of aberration states and the plurality of element light sources, the optical image of the temporary pattern of the mask, which is formed in the evaluation area set in the evaluation area setting step when one aberration state selected from the plurality of aberration states set in the aberration state setting step is produced in the projection optical system, and the temporary pattern of the mask is illuminated with one element light source selected from the plurality of element light sources generated in the generating step; and a determining step of determining, based on the optical images calculated in the calculating step, a parameter used to define a shape of a pattern of the mask, and a weight to be applied to each of the plurality of element light sources so that an edge position, in the evaluation area, of each of the optical images of the temporary pattern of the mask comes close to a target edge position, and determining, as the pattern of the mask and the light intensity distribution to be formed on the pupil plane of the illumination optical system, a pattern defined by the determined parameter and a light source obtained by combining the plurality of element light sources applied with the weights, respectively, wherein the pattern setting step, the evaluation area setting step, the generating step, the aberration state setting step, the calculating step, and the calculating step are performed by a computer.

8. A non-transitory computer-readable storage medium storing a program executable by a computer to execute a determination method of determining a light intensity distribution to be formed on a pupil plane of an illumination optical system that illuminates a mask of an exposure apparatus including the illumination optical system and a projection optical system that projects a pattern of the mask onto a substrate, and setting the determined light intensity distribution to the illumination optical system of the exposure apparatus, the method comprising:

a pattern setting step of setting a pattern of a mask to be placed on an object plane of the projection optical system;

an evaluation area setting step of setting an evaluation area used to evaluate an optical image of the pattern of the mask set in the pattern setting step, which is formed on the image plane of the projection optical system;

a generating step of generating a plurality of element light sources formed on the pupil plane of the illumination optical system;

an aberration state setting step of setting a plurality of different aberration states that are expected to exist in the projection optical system;

a calculating step of calculating, for each of all combinations of the plurality of aberration states and the plurality of element light sources, the optical image of the pattern of the mask, which is formed in the evaluation area set in the evaluation area setting step when one aberration state selected from the plurality of aberration states set in the aberration state setting step is produced in the projection optical system, and the pattern of the mask is illuminated with one element light source selected from the plurality of element light sources generated in the generating step; and a determining step of determining, based on the optical images calculated in the calculating step, a weight to be applied to each of the plurality of element light sources so that an edge position, in the evaluation area, of each of the optical images of the pattern of the mask comes close to a target edge position, and determining, as the light intensity distribution to be formed on the pupil plane of the illumination optical system, a light source obtained by combining the plurality of element light sources applied with the weights.

9. A non-transitory computer-readable storage medium storing a program executable by a computer to execute a determination method of determining a pattern of a mask used in an exposure apparatus including an illumination optical system that illuminates the mask, and a projection optical system that projects the pattern of the mask onto a substrate, and a light intensity distribution to be formed on a pupil plane of the illumination optical system setting the mask having the determined pattern in the exposure apparatus, and setting the determined light intensity distribution to the illumination optical system of the exposure apparatus, the method comprising:

a pattern setting step of setting a temporary pattern of a mask to be placed on an object plane of the projection optical system;

an evaluation area setting step of setting an evaluation area used to evaluate an optical image of the temporary pattern of the mask set in the pattern setting step, which is formed on the image plane of the projection optical system;

a generating step of generating a plurality of element light sources formed on the pupil plane of the illumination optical system;

an aberration state setting step of setting a plurality of different aberration states that are expected to exist in the projection optical system;

a calculating step of calculating, for each of all combinations of the plurality of aberration states and the plurality of element light sources, the optical image of the temporary pattern of the mask, which is formed in the evaluation area set in the evaluation area setting step when one aberration state selected from the plurality of aberration states set in the aberration state setting step is produced in the projection optical system, and the temporary pattern of the mask is illuminated with one element light source selected from the plurality of element light sources generated in the generating step; and a determining step of determining, based on the optical images calculated in the calculating step, a parameter used to define a shape of a pattern of the mask, and a weight to be applied to each of the plurality of element light sources so that an edge position, in the evaluation area, of each of the optical images of the temporary pattern of the mask comes close to a target edge position, and determining, as the pattern of the mask and the light intensity distribution to be formed on the pupil plane of the illumination optical system, a pattern defined by the determined parameter and a light source obtained by combining the plurality of element light sources applied with the weights, respectively.

10. An exposure method of exposing a substrate to light, the method comprising:

a light intensity distribution determining step of determining a light intensity distribution to be formed on a pupil plane of an illumination optical system that illuminates a mask;

an illuminating step of illuminating the mask with light emitted by the illumination optical system that forms the light intensity distribution determined in the light intensity distribution determining step; and a projecting step of projecting an image of a pattern of the mask onto the substrate via a projection optical system, wherein the light intensity distribution determining step includes:

a pattern setting step of setting a pattern of a mask to be placed on an object plane of the projection optical system;

an evaluation area setting step of setting an evaluation area used to evaluate an optical image of the pattern of the mask set in the pattern setting step, which is formed on the image plane of the projection optical system;

a generating step of generating a plurality of element light sources formed on the pupil plane of the illumination optical system;

an aberration state setting step of setting a plurality of different aberration states that are expected to exist in the projection optical system;

a calculating step of calculating, for each of all combinations of the plurality of aberration states and the plurality of element light sources, the optical image of the pattern of the mask, which is formed in the evaluation area set in the evaluation area setting step when one aberration state selected from the plurality of aberration states set in the aberration state setting step is produced in the projection optical system, and the pattern of the mask is illuminated with one element light source selected from the plurality of element light sources generated in the generating step; and a determining step of determining, based on the optical images calculated in the calculating step, a weight to be applied to each of the plurality of element light sources so that an edge position, in the evaluation area, of each of the optical images of the pattern of the mask comes close to a target edge position, and determining, as the light intensity distribution to be formed on the pupil plane of the illumination optical system, a light source obtained by combining the plurality of element light sources applied with the weights, and wherein the light intensity determining step is performed by a computer.

11. An exposure method of exposing a substrate to light, the method comprising:

a pattern and light intensity distribution determining step of determining a pattern of a mask used in an exposure apparatus including an illumination optical system that illuminates the mask, and a light intensity distribution to be formed on a pupil plane of the illumination optical system;

an illuminating step of illuminating the pattern of the mask determined in the pattern and light intensity distribution determining step, with light emitted by the illumination optical system that forms the light intensity distribution determined in the pattern and light intensity distribution determining step; and a projecting step of projecting an image of the pattern of the mask onto the substrate via a projection optical system, and wherein the pattern and light intensity distribution determining step includes:

a pattern setting step of setting a temporary pattern of a mask to be placed on an object plane of the projection optical system;

an evaluation area setting step of setting an evaluation area used to evaluate an optical image of the temporary pattern of the mask set in the pattern setting step, which is formed on the image plane of the projection optical system;

a generating step of generating a plurality of element light sources formed on the pupil plane of the illumination optical system;

an aberration state setting step of setting a plurality of different aberration states that are expected to exist in the projection optical system;

a calculating step of calculating, for each of all combinations of the plurality of aberration states and the plurality of element light sources, the optical image of the temporary pattern of the mask, which is formed in the evaluation area set in the evaluation area setting step when one aberration state selected from the plurality of aberration states set in the aberration state setting step is produced in the projection optical system, and the temporary pattern of the mask is illuminated with one element light source selected from the plurality of element light sources generated in the generating step; and a determining step of determining, based on the optical images calculated in the calculating step, a parameter used to define a shape of a pattern of the mask, and a weight to be applied to each of the plurality of element light sources so that an edge position, in the evaluation area, of each of the optical images of the temporary pattern of the mask comes close to a target edge position, and determining, as the pattern of the mask and the light intensity distribution to be formed on the pupil plane of the illumination optical system, a pattern defined by the determined parameter and a light source obtained by combining the plurality of element light sources applied with the weights, respectively, and wherein the pattern and light intensity distribution determining is performed by a computer.

* * * * *